(12) United States Patent
Yamazaki et al.

(10) Patent No.: US 9,911,856 B2
(45) Date of Patent: Mar. 6, 2018

(54) SEMICONDUCTOR DEVICE

(75) Inventors: Shunpei Yamazaki, Tokyo (JP); Akiharu Miyanaga, Kanagawa (JP); Masahiro Takahashi, Kanagawa (JP); Hideyuki Kishida, Kanagawa (JP); Junichiro Sakata, Kanagawa (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 6 days.

(21) Appl. No.: 12/900,145

(22) Filed: Oct. 7, 2010

(65) Prior Publication Data
US 2011/0084273 A1   Apr. 14, 2011

(30) Foreign Application Priority Data
Oct. 9, 2009   (JP) .................................. 2009-235104

(51) Int. Cl.
*H01L 29/786* (2006.01)
*H01L 29/423* (2006.01)

(52) U.S. Cl.
CPC .... *H01L 29/7869* (2013.01); *H01L 29/42384* (2013.01); *H01L 29/78606* (2013.01); *H01L 29/78696* (2013.01)

(58) Field of Classification Search
CPC ........... H01L 21/28176; H01L 27/1225; H01L 29/4908; H01L 29/78606; H01L 29/7869;
(Continued)

(56) References Cited

U.S. PATENT DOCUMENTS 5,517,036 A * 5/1996 Semba ...................... G01R 1/06
                                                                    257/207
5,731,856 A   3/1998 Kim et al.
(Continued)

FOREIGN PATENT DOCUMENTS

CN      001828932 A    9/2006
CN      001941299 A    4/2007
(Continued)

OTHER PUBLICATIONS

Stanley Wolf Ph.D. and Richard Tauber Ph.D. Silicon Processing for the VLSI ERA, Published by Lattice Press in1986, vol. 1, pp. 220, 221 and 227.*
(Continued)

*Primary Examiner* — Mohsen Ahmadi
*Assistant Examiner* — Fang-Xing Jiang
(74) *Attorney, Agent, or Firm* — Fish & Richardson P.C.

(57) ABSTRACT

One of objects is to provide a semiconductor device with stable electric characteristics, in which an oxide semiconductor is used. The semiconductor device includes a thin film transistor including an oxide semiconductor layer, and a silicon oxide layer over the thin film transistor. The thin film transistor includes a gate electrode layer, a gate insulating layer whose thickness is equal to or larger than 100 nm and equal to or smaller than 350 nm, the oxide semiconductor layer, a source electrode layer and a drain electrode layer. In the thin film transistor, the difference of the threshold voltage value is 1 V or less between before and after performance of a measurement in which the voltage of 30 V or –30 V is applied to the gate electrode layer at a temperature of 85° C. for 12 hours.

8 Claims, 21 Drawing Sheets

(58) Field of Classification Search
CPC ........ H01L 21/02554; H01L 29/78696; G01R 1/06
USPC ............................. 257/43–100; 438/795, 104
See application file for complete search history.

(56) References Cited

U.S. PATENT DOCUMENTS

| | | | |
|---|---|---|---|
| 5,744,864 | A | 4/1998 | Cillessen et al. |
| 5,847,410 | A | 12/1998 | Nakajima |
| 6,294,274 | B1 | 9/2001 | Kawazoe et al. |
| 6,563,174 | B2 | 5/2003 | Kawasaki et al. |
| 6,586,346 | B1 | 7/2003 | Yamazaki et al. |
| 6,727,522 | B1 | 4/2004 | Kawasaki et al. |
| 6,759,283 | B2 | 7/2004 | Yasuda et al. |
| 6,960,812 | B2 | 11/2005 | Yamazaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause |
| 7,211,825 | B2 | 5/2007 | Shin et al. |
| 7,282,782 | B2 | 10/2007 | Hoffman et al. |
| 7,297,977 | B2 | 11/2007 | Hoffman et al. |
| 7,301,211 | B2 | 11/2007 | Yamazaki et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,608,531 | B2 | 10/2009 | Isa et al. |
| 7,674,650 | B2 | 3/2010 | Akimoto et al. |
| 7,732,819 | B2 | 6/2010 | Akimoto et al. |
| 7,829,444 | B2 | 11/2010 | Yabuta et al. |
| 8,110,436 | B2 | 2/2012 | Hayashi et al. |
| 8,148,779 | B2 | 4/2012 | Jeong et al. |
| 8,164,256 | B2 | 4/2012 | Sano et al. |
| 8,384,077 | B2 | 2/2013 | Yano et al. |
| 8,487,436 | B2 | 7/2013 | Isa et al. |
| 8,541,944 | B2 | 9/2013 | Sano et al. |
| 8,563,977 | B2 | 10/2013 | Shimada et al. |
| 8,581,243 | B2 | 11/2013 | Takahashi et al. |
| 8,648,346 | B2 | 2/2014 | Isa et al. |
| 8,785,240 | B2 | 7/2014 | Watanabe |
| 8,822,264 | B2* | 9/2014 | Yamazaki ............ H01L 29/4908 257/E21.46 |
| 9,012,908 | B2* | 4/2015 | Yamazaki ......... H01L 29/78606 257/43 |
| 9,082,857 | B2* | 7/2015 | Yamazaki ............ H01L 29/4908 |
| 9,171,938 | B2* | 10/2015 | Yamazaki ............ H01L 27/1225 257/43 |
| 9,224,609 | B2 | 12/2015 | Yamazaki ......... H01L 21/28176 |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2002/0171084 | A1 | 11/2002 | Yasuda et al. |
| 2003/0107023 | A1* | 6/2003 | Chae et al. ................ 252/79.1 |
| 2003/0189401 | A1 | 10/2003 | Kido et al. |
| 2003/0218222 | A1 | 11/2003 | Wager et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Theiss et al. |
| 2006/0231882 | A1 | 10/2006 | Kim et al. |
| 2006/0238135 | A1 | 10/2006 | Kimura |
| 2006/0244107 | A1 | 11/2006 | Sugihara |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0063211 | A1* | 3/2007 | Iwasaki ............................ 257/98 |
| 2007/0072439 | A1* | 3/2007 | Akimoto et al. ............. 438/795 |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0203387 | A1 | 8/2008 | Kang et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2008/0308796 | A1 | 12/2008 | Akimoto et al. |
| 2008/0308797 | A1 | 12/2008 | Akimoto et al. |
| 2008/0308805 | A1 | 12/2008 | Akimoto et al. |
| 2008/0308806 | A1 | 12/2008 | Akimoto et al. |
| 2009/0008639 | A1 | 1/2009 | Akimoto et al. |
| 2009/0045397 | A1* | 2/2009 | Iwasaki ............................ 257/43 |
| 2009/0065771 | A1 | 3/2009 | Iwasaki et al. |
| 2009/0068773 | A1 | 3/2009 | Lai et al. |
| 2009/0073325 | A1 | 3/2009 | Kuwabara et al. |
| 2009/0090915 | A1* | 4/2009 | Yamazaki et al. ............. 257/66 |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0025678 | A1 | 2/2010 | Yamazaki et al. |
| 2010/0059751 | A1 | 3/2010 | Takahashi et al. |
| 2010/0065844 | A1 | 3/2010 | Tokunaga |
| 2010/0084648 | A1 | 4/2010 | Watanabe |
| 2010/0092800 | A1 | 4/2010 | Itagaki et al. |
| 2010/0102313 | A1 | 4/2010 | Miyairi et al. |
| 2010/0109002 | A1 | 5/2010 | Itagaki et al. |
| 2010/0203673 | A1 | 8/2010 | Hayashi et al. |
| 2010/0213459 | A1 | 8/2010 | Shimada et al. |
| 2010/0267198 | A1 | 10/2010 | Yabuta et al. |
| 2010/0289020 | A1 | 11/2010 | Yano et al. |
| 2011/0006297 | A1 | 1/2011 | Inoue et al. |
| 2011/0062435 | A1 | 3/2011 | Yamazaki et al. |
| 2011/0079778 | A1* | 4/2011 | Yamazaki ......... H01L 21/02554 257/43 |
| 2011/0101335 | A1* | 5/2011 | Yamazaki ............ H01L 27/1225 257/43 |

(56) References Cited

U.S. PATENT DOCUMENTS

| | | | |
|---|---|---|---|
| 2012/0132911 A1 | 5/2012 | Shimada et al. | |
| 2013/0146452 A1 | 6/2013 | Yano et al. | |
| 2013/0146862 A1* | 6/2013 | Kim | H01L 29/7869 257/43 |
| 2014/0138680 A1 | 5/2014 | Isa et al. | |
| 2017/0162719 A1* | 6/2017 | Yamazaki | H01L 29/78696 |

FOREIGN PATENT DOCUMENTS

| | | |
|---|---|---|
| EP | 1 737 044 A1 | 12/2006 |
| EP | 1770788 A | 4/2007 |
| EP | 2 226 847 A2 | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 03-231472 A | 10/1991 |
| JP | 05-251705 A | 9/1993 |
| JP | 08-264794 A | 10/1996 |
| JP | 08-338998 A | 12/1996 |
| JP | 11-505377 A | 5/1999 |
| JP | 11-274504 A | 10/1999 |
| JP | 2000-044236 A | 2/2000 |
| JP | 2000-150900 A | 3/2002 |
| JP | 2002-076356 A | 3/2002 |
| JP | 2002-289659 A | 10/2002 |
| JP | 2003-037270 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-191077 A | 7/2005 |
| JP | 2006-106106 A | 4/2006 |
| JP | 2006-165531 A | 6/2006 |
| JP | 2006-237587 A | 9/2006 |
| JP | 2007-073560 A | 3/2007 |
| JP | 2007-096055 A | 4/2007 |
| JP | 2007-123861 A | 5/2007 |
| JP | 2007-250983 A | 9/2007 |
| JP | 2007-298605 A | 11/2007 |
| JP | 2008-281988 A | 11/2008 |
| JP | 2009-099944 A | 5/2009 |
| JP | 2009-099953 A | 5/2009 |
| JP | 2009-194351 A | 8/2009 |
| JP | 2009-224479 A | 10/2009 |
| KR | 2006-0087455 A | 8/2006 |
| TW | 200847421 | 12/2008 |
| TW | 200937528 | 9/2009 |
| TW | 201010085 | 3/2010 |
| WO | 2004/114391 A1 | 12/2004 |
| WO | 2007/119386 A1 | 10/2007 |
| WO | WO-2008/069286 | 6/2008 |
| WO | 2008126879 A1 | 10/2008 |
| WO | 2008139859 A1 | 11/2008 |
| WO | 2009/041713 A2 | 4/2009 |
| WO | WO-2009/041544 | 4/2009 |
| WO | WO-2009/075281 | 6/2009 |

OTHER PUBLICATIONS

Asakuma, N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.
Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.
Clark, S et al., "First Principles Methods Using CASTEP," Zeitschrift fur Kristallographie, 2005, vol. 220, pp. 567-570.
Coates, D et al., "Optical Studies of the Amorphous Liquid-Cholesteric Liquid Crystal Transition: The Blue Phase," Physics Letters, Sep. 10, 1973, vol. 45A, No. 2, pp. 115-116.
Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.
Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.
Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.
Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.
Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.
Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.
Hayashi, R et al., "42.1: Invited Paper: Improved Amorphous In—Ga—Zn—O TFTs," SID Digest '08 : SID International Symposium Digest of Technical Papers, May 20, 2008, vol. 39, pp. 621-624.
Hirao, T et al., "Novel Top-Gate Zinc Oxide Thin-Film Transistors (ZnO TFTs) for AMLCDS," Journal of the SID , 2007, vol. 15, No. 1, pp. 17-22.
Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.
Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.
Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.
Ikeda., T et al., "Full-Functional System Liquid Crystal Display Using Cg-Silicon Technology," SID Digest '04 : SID International Symposium Digest of Technical Papers, 2004, vol. 35, pp. 860-863.
Janotti, A et al., "Native Point Defects in ZnO," Phys. Rev. B (Physical Review. B), 2007, vol. 76, No. 16, pp. 165202-1-165202-22.
Janotti, A et al., "Oxygen Vacancies in ZnO," Appl. Phys. Lett. (Applied Physics Letters), 2005, vol. 87, pp. 122102-1-122102-3.
Jeong, J et al., "3.1: Distinguished Paper. 12.1-inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.
Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.
Kanno, H et al., "White Stacked Electrophosphorecent Organic Light-Emitting Devices Employing MoO3 As a Charge-Generation Layer," Adv. Mater. (Advanced Materials), 2006, vol. 18, No. 3, pp. 339-342.

(56) References Cited

OTHER PUBLICATIONS

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL,YbFe2O4, and Yb2Fe3O7 Types of Structures for Compounds in the IN2O3 and SC2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995. vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981. vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system of 1350° C." Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2008, vol. 45, No. 5B, pp. 4303-4308.

Nomura. K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn-Oxide TFTs With a Novel Passivation Layer," SID Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTs and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

(56) References Cited

OTHER PUBLICATIONS

Sakata, J et al., "Development of 4.0-In. AMOLED Display with Driver Circuit Using Amorphous In—Ga—Zn-Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor" IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proccedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

International Search Report (Application No. PCT/JP2010/066632) dated Oct. 26, 2010, 2 pages.

Written Opinion (Application No. PCT/JP2010/066632) dated Oct. 26, 2010, 3 pages.

Ohta, Y et al., "Amorphous In—Ga—Zn—O TFT-LCDs with High Reliability," IDW '09 : Proceedings of the 16th International Display Workshops, Dec. 9, 2009, vol. 3, pp. 1685-1688.

Masaki Nakamura et al.; "Synthesis and crystal structures of new homologous compounds, indium iron zinc oxides (InFeO3(ZnO)m) (m: natural number) and related compounds"; Kotai Butsuri (Solid State Physics); 1993; pp. 317-327; vol. 28, No. 5 with translation.

International Search Report (International Application No. PCT/JP2010/065568) dated Oct. 12, 2010, 2 pages.

Written Opinion (International Application No. PCT/JP2010/065568) dated Oct. 12, 2010, 4 pages.

Taiwanese Office Action (Application No. 099134227) dated Sep. 25, 2015.

\* cited by examiner

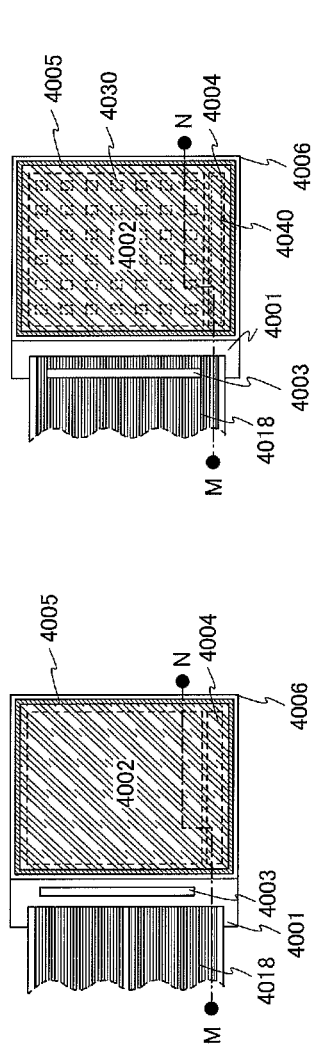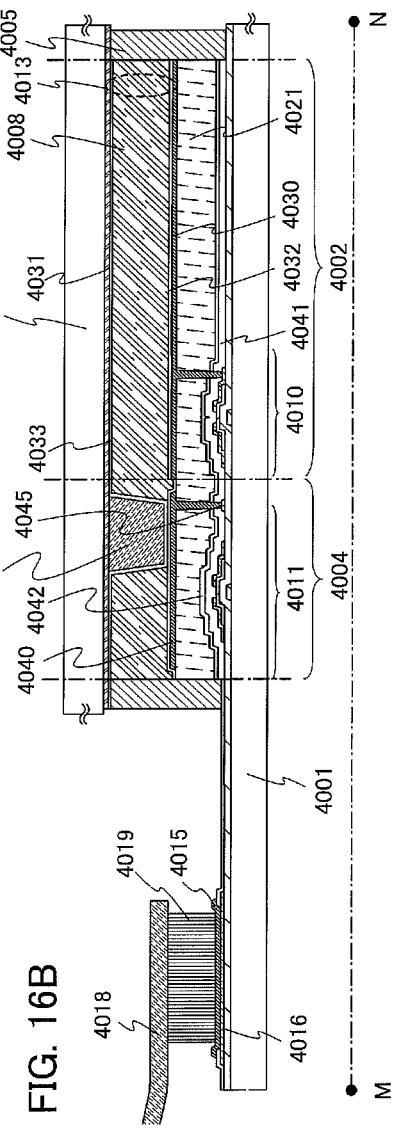

SEMICONDUCTOR DEVICE

TECHNICAL FIELD

The present invention relates to a semiconductor device including an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as integrated circuits (ICs) and electro-optical devices, and thin film transistors that are used as switching elements in image display devices are, in particular, urgently developed. Various metal oxides are used for a variety of applications. Indium oxide is a well-known material and is used as a transparent electrode material which is necessary for liquid crystal displays and the like.

Some metal oxides have semiconductor characteristics. Examples of such metal oxides having semiconductor characteristics include tungsten oxide, tin oxide, indium oxide, zinc oxide, and the like. Thin film transistors in which a channel formation region is formed using such metal oxides having semiconductor characteristics are already known (see Patent Documents 1 and 2).

REFERENCE

[Patent Document 1] Japanese Published Patent Application No. 2007-123861
[Patent Document 2] Japanese Published Patent Application No. 2007-096055

DISCLOSURE OF INVENTION

However, a difference from a stoichiometric composition is generated in an oxide semiconductor during a thin film formation process. For example, electric conductivity of the oxide semiconductor varies due to excess or deficiency of oxygen. Hydrogen or moisture entering the oxide semiconductor during a thin film formation process forms an oxygen (O)-hydrogen (H) bond to be an electron donor, which becomes a factor of variation in electrical conductivity. Further, the O—H bond is a polar molecule, and it becomes a factor of variation in characteristics of an active device such as a thin film transistor including an oxide semiconductor.

In view of the above problem, an object of one embodiment of the present invention is to provide a semiconductor device with stable electric characteristics, in which an oxide semiconductor is used.

In order to suppress variation in electric characteristics of a thin film transistor including an oxide semiconductor layer, the thickness of a gate insulating layer is controlled, so that an impurity serving as a variation factor, such as hydrogen, moisture, hydroxyl or hydride (also referred to as a hydrogen compound), is prevented from entering the oxide semiconductor layer and an interface between the oxide semiconductor layer and an oxide insulating layer (a silicon oxide layer) formed to be in contact with the oxide semiconductor layer.

An embodiment of the present invention is a semiconductor device including a thin film transistor, where a difference of a threshold voltage of the thin film transistor between before and after performance of a measurement is 1 V (±1 V) or less. As the measurement, a gate electrode layer is supplied with a voltage of 30 V or −30 V (the gate voltage Vg is 30 V or −30 V) at a temperature of 85° C. for 12 hours. In the thin film transistor, the thickness of a gate insulating layer is equal to or larger than 100 nm and equal to or smaller than 350 nm, and a hydrogen concentration in the oxide semiconductor layer and a hydrogen concentration in an interface between the oxide semiconductor layer and an oxide insulating layer (a silicon oxide layer) formed in contact with the oxide semiconductor layer are $5 \times 10^{19}/cm^3$ or lower, preferably, $1 \times 10^{19}/cm^3$ or lower.

The gate insulating layer can be a silicon oxide layer or a stacked layer in which a silicon nitride layer and a silicon oxide layer are formed in this order over the gate electrode layer. A 100 nm-thick silicon oxide layer, or a stacked layer in which a 100-nm-thick silicon nitride layer and a 100-nm-thick silicon oxide layer are formed in this order over the gate electrode layer may be employed.

When the thickness of the gate insulating layer is controlled to be equal to or larger than 100 nm and equal to or smaller than 350 nm, a thin film transistor with stable electric characteristics can be formed. In such a thin film transistor, a difference of the threshold voltage is 1 V (±1 V) or less, between before and after performance of a measurement in which a voltage of 30 V or −30 V is applied to the gate electrode layer (the gate voltage Vg is 30 V or −30 V) at a temperature of 85° C. for 12 hours.

Note that in the measurement, a source electrode layer and a drain electrode layer are given a constant voltage (ground voltage). The hydrogen concentration is a value obtained from the quantified result by secondary ion mass spectrometry (SIMS).

The concentration of an impurity in the oxide semiconductor layer may be reduced as follows. A silicon oxide layer ($SiO_x$, preferably x is greater than or equal to 2) having many defects typified by dangling bonds is formed in contact with the oxide semiconductor layer, so that an impurity such as hydrogen or moisture (a hydrogen atom or a compound including a hydrogen atom such as $H_2O$) included in the oxide semiconductor layer is diffused into the silicon oxide layer.

The defects included in the silicon oxide layer include dangling bonds of silicon, dangling bonds of oxygen, or dangling bonds of both silicon and oxygen. The silicon oxide layer including many dangling bonds of oxygen as defects is preferable because the binding energy mainly with respect to hydrogen is further increased, and diffusion of an impurity from the oxide semiconductor layer into the silicon oxide layer is promoted; accordingly, the impurity can be stabilized in the silicon oxide layer.

The oxide semiconductor layer or the silicon oxide layer in contact with the oxide semiconductor layer may be formed in a treatment chamber in which the impurity concentration is reduced by evacuation with use of a cryopump.

As each of sputtering gases used in depositing the oxide semiconductor layer and the silicon oxide layer in contact with the oxide semiconductor layer, a high-purity gas is preferably used, in which an impurity such as hydrogen, water, hydroxyl or hydride is reduced to such a degree that the impurity concentration level is represented by the unit "ppm" or "ppb".

One embodiment of the invention disclosed in this specification is a semiconductor device including a gate electrode layer, a gate insulating layer with a thickness equal to or larger than 100 nm and equal to or smaller than 350 nm over the gate electrode layer, an oxide semiconductor layer over the gate insulating layer, a source electrode layer and a drain electrode layer over the oxide semiconductor layer, a thin film transistor including the oxide semiconductor layer, and a silicon oxide layer which is over the source electrode layer and the drain electrode layer and partly in contact with the oxide semiconductor layer. In the thin film transistor, a difference of a threshold voltage is 1 V or less between before and after performance of a measurement in which a voltage of 30 V or −30 V is applied to the gate electrode layer at a temperature of 85° C. for 12 hours.

Another embodiment of the invention disclosed in this specification is a semiconductor device including a gate electrode layer, a gate insulating layer with a thickness equal to or larger than 100 nm and equal to or smaller than 350 nm over the gate electrode layer, an oxide semiconductor layer over the gate insulating layer, a source electrode layer and a drain electrode layer over the oxide semiconductor layer, a thin film transistor including the oxide semiconductor layer, and a silicon oxide layer which is over the source electrode layer and the drain electrode layer and partly in contact with the oxide semiconductor layer. A hydrogen concentration in the oxide semiconductor layer and a hydrogen concentration in an interface between the oxide semiconductor layer and the silicon oxide layer, which are measured by secondary ion mass spectrometry, are $5\times10^{19}/cm^3$ or lower. In the thin film transistor, a difference of the threshold voltage is 1 V or less between before and after performance of a measurement in which a voltage of 30 V or −30 V is applied to the gate electrode layer at a temperature of 85° C. for 12 hours.

In the above structure, the silicon oxide layer preferably includes many defects. Further, a mixed region is provided at the interface between the oxide semiconductor layer and the silicon oxide layer, and the mixed layer may include oxygen, silicon, and at least one kind of metal elements included in the oxide semiconductor layer. The mixed region may have a thickness of 1 nm to 10 nm (preferably 2 nm to 5 nm). Provision of the mixed layer makes the interface between the oxide semiconductor layer and the silicon oxide layer unclear, whereby hydrogen is more easily diffused from the oxide semiconductor layer into the silicon oxide layer.

In the above structure, a protective insulating layer covering the silicon oxide layer may be provided.

Another embodiment of the invention disclosed in this specification is a method for manufacturing a semiconductor device including the following steps: forming a gate electrode layer over a substrate; forming a gate insulating layer with a thickness equal to or larger than 100 nm and equal to or smaller than 350 nm to cover the gate electrode layer; introducing the substrate into a first treatment chamber which is kept in a reduced pressure state; introducing a sputtering gas in which hydrogen and moisture are removed while removing residual moisture in the first treatment chamber; forming an oxide semiconductor layer over the gate insulating layer with use of a metal oxide target provided in the first treatment chamber; forming a source electrode layer and a drain electrode layer over the oxide semiconductor layer; introducing the substrate into a second treatment chamber; introducing a sputtering gas in which hydrogen and moisture are removed and oxygen is included while removing residual moisture in the second treatment chamber; forming a silicon oxide layer including a defect over the oxide semiconductor layer with use of a target including silicon provided in the second treatment chamber; and heating the substrate to a temperature of 100° C. to 400° C. so that hydrogen or moisture included in the oxide semiconductor layer is diffused to the silicon oxide layer side.

Another embodiment of the invention disclosed in this specification is a method for manufacturing a semiconductor device including the following steps: forming a gate electrode layer over a substrate; forming a gate insulating layer with a thickness equal to or larger than 100 nm and equal to or smaller than 350 nm to cover the gate electrode layer; introducing the substrate into a first treatment chamber which is kept in a reduced pressure state; introducing a sputtering gas in which hydrogen and moisture are removed while removing residual moisture in the first treatment chamber; forming an oxide semiconductor layer over the gate insulating layer with use of a metal oxide target provided in the first treatment chamber; forming a source electrode layer and a drain electrode layer over the oxide semiconductor layer; introducing the substrate into a second treatment chamber; introducing a sputtering gas in which hydrogen and moisture are removed and oxygen is included while removing residual moisture in the second treatment chamber; forming a silicon oxide layer including a defect over the oxide semiconductor layer with use of a target including silicon provided in the second treatment chamber; introducing the substrate into a third treatment chamber which is kept in a reduced pressure state; introducing a sputtering gas in which hydrogen and moisture are removed and nitrogen is included while removing residual moisture in the third treatment chamber; forming a silicon nitride layer over the silicon oxide layer with use of a target including silicon provided in the third treatment chamber; and heating the substrate to a temperature of 100° C. to 400° C. so that hydrogen or moisture included in the oxide semiconductor layer is diffused to the silicon oxide layer side.

Another embodiment of the invention disclosed in this specification is a method for manufacturing a semiconductor device including the following steps: forming a gate electrode layer over a substrate; forming a gate insulating layer with a thickness equal to or larger than 100 nm and equal to or smaller than 350 nm to cover the gate electrode layer; introducing the substrate into a first treatment chamber which is kept in a reduced pressure state; introducing a sputtering gas in which hydrogen and moisture are removed while removing residual moisture in the first treatment chamber; forming an oxide semiconductor layer over the gate insulating layer with use of a metal oxide target provided in the first treatment chamber; forming a source electrode layer and a drain electrode layer over the oxide semiconductor layer; introducing the substrate into a second treatment chamber; introducing a sputtering gas in which hydrogen and moisture are removed and oxygen is included while removing residual moisture in the second treatment chamber; forming a silicon oxide layer including a defect over the oxide semiconductor layer with use of a target including silicon provided in the second treatment chamber; introducing the substrate into a third treatment chamber which is kept in a reduced pressure state; heating the substrate to a temperature of 100° C. to 400° C.; introducing a sputtering gas in which hydrogen and moisture are removed and nitrogen is included while removing residual moisture in the third treatment chamber; and forming a silicon nitride layer over the silicon oxide layer with use of a target including silicon provided in the third treatment chamber so that hydrogen or moisture included in the oxide semiconductor layer is diffused to the silicon oxide layer side.

Another embodiment of the invention disclosed in this specification is a method for manufacturing a semiconductor device including the following steps: forming a gate electrode layer over a substrate; forming a gate insulating layer with a thickness equal to or larger than 100 nm and equal to or smaller than 350 nm to cover the gate electrode layer; introducing the substrate into a first treatment chamber which is kept in a reduced pressure state; introducing a sputtering gas in which hydrogen and moisture are removed while removing residual moisture in the first treatment chamber; forming an oxide semiconductor layer over the gate insulating layer with use of a metal oxide target provided in the first treatment chamber; forming a source electrode layer and a drain electrode layer over the oxide semiconductor layer; introducing the substrate into a second treatment chamber; introducing a sputtering gas in which hydrogen and moisture are removed and oxygen is included while removing residual moisture in the second treatment chamber; forming a silicon oxide layer including a defect over the oxide semiconductor layer with use of a silicon semiconductor target provided in the second treatment chamber; introducing a sputtering gas including nitrogen which is switched from the sputtering gas including oxygen; forming a silicon nitride layer over the silicon oxide layer with use of a silicon semiconductor target provided in the second treatment chamber; and heating the substrate over which the silicon nitride layer is formed to a temperature of 100° C. to 400° C. so that hydrogen or moisture included in the oxide semiconductor layer is diffused to the silicon oxide layer side.

In the above manufacturing method of a semiconductor device, the silicon oxide layer including a defect can be formed over the oxide semiconductor layer in a condition where the temperature of the substrate introduced into the second treatment chamber is 0° C. to 50° C.

In the above manufacturing method of a semiconductor device, an adsorption vacuum pump is preferably used for evacuation of the first treatment chamber and/or the second treatment chamber when the oxide semiconductor layer and/or the silicon oxide layer are/is formed. For example, a cryopump, an ion pump, or a titanium sublimation pump is preferably used. The adsorption vacuum pump is used for reducing the amount of hydrogen, water, hydroxyl or hydride included in the oxide semiconductor layer and/or the silicon oxide layer.

In the above manufacturing method of a semiconductor device, as the target used for formation of the oxide semiconductor layer, a substance including zinc oxide as a main component can be used. Alternatively, a metal oxide including indium, gallium, or zinc can be used as the target.

In the above manufacturing method of a semiconductor device, a silicon semiconductor target or a synthetic quartz target can be used as the target including silicon used for formation of the silicon oxide layer.

With the above structures, at least one of the objects can be achieved.

The oxide semiconductor layer is a thin film represented by $InMO_3(ZnO)_m$ ($m>0$). This thin film is used as the oxide semiconductor layer to fabricate the thin film transistor. Note that M denotes one metal element or a plurality of metal elements selected from Ga, Fe, Ni, Mn, and Co. As an example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is contained as an impurity element in addition to a metal element contained as M In this specification, among the oxide semiconductor layers whose composition formulae are represented by $InMO_3(ZnO)_m$ ($m>0$), an oxide semiconductor whose composition formula includes at least Ga as M is referred to as an In—Ga—Zn—O-based oxide semiconductor, and a thin film of the In—Ga—Zn—O-based oxide semiconductor is referred to as an In—Ga—Zn—O-based film.

As other examples of the metal oxide applicable to the oxide semiconductor layer, any of the following metal oxides can be applied: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be included in the oxide semiconductor layer formed using the above metal oxide.

Further, an oxide conductive layer may be formed between the oxide semiconductor layer and the source and drain electrodes. The oxide conductive layer and a metal layer for forming the source and drain electrodes can be formed in succession.

Since a thin film transistor is easily broken due to static electricity or the like, a protective circuit for protecting the thin film transistor in a pixel portion is preferably provided over the same substrate for a gate line or a source line. The protective circuit is preferably formed with a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

According to the present invention, a semiconductor device including an oxide semiconductor with stable electric characteristics can be provided.

BRIEF DESCRIPTION OF DRAWINGS

FIGS. 16A to 16C illustrate semiconductor devices.

BEST MODE FOR CARRYING OUT THE INVENTION

Figure 1A:
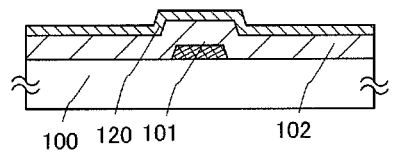
FIGS. 1A to 1E illustrate a method for manufacturing a semiconductor device.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, one embodiment of a semiconductor device and a manufacturing method thereof will be described with reference to FIGS. 1A to 1E. A semiconductor device described in this embodiment is a thin film transistor.

An example of cross-sectional structures of a semiconductor device is illustrated in FIGS. 1A to 1E. A thin film transistor 110 illustrated in FIG. 1E has one kind of bottom-gate structure called a channel-etched type and is also called an inverted staggered thin film transistor.

In order to suppress variation in electric characteristics of a thin film transistor including an oxide semiconductor layer, the thickness of a gate insulating layer is controlled, so that an impurity serving as a variation factor, such as hydrogen, moisture, hydroxyl or hydride, is prevented from entering the oxide semiconductor layer and an interface between the oxide semiconductor layer and an oxide insulating layer (a silicon oxide layer) formed to be in contact with the oxide semiconductor layer.

Thus, in the case where a measurement is performed on the thin film transistor 110 included in a semiconductor device of this embodiment, in which a voltage of 30 V or −30 V is applied to a gate electrode layer (i.e., the gate voltage Vg is set to 30 V or −30 V) at a temperature of 85° C. for 12 hours, the difference of the threshold voltage of the thin film transistor 110 is 1 V (±1 V) or less, between before and after performance of the measurement. In the thin film transistor 110, the thickness of the gate insulating layer is controlled to be equal to or larger than 100 nm and equal to or smaller than 350 nm, and the hydrogen concentrations in the oxide semiconductor layer and the interface between the oxide semiconductor layer and the oxide insulating layer (the silicon oxide layer) formed in contact therewith are controlled to be $5 \times 10^{19}/cm^3$ or lower, preferably, $1 \times 10^{19}/cm^3$ or lower.

Note that in the measurement, a source electrode layer and a drain electrode layer are given a constant voltage (ground voltage). The hydrogen concentration is a value obtained from the quantified result by secondary ion mass spectrometry (SIMS).

Although the thin film transistor 110 is described as a single-gate thin film transistor, a multi-gate thin film transistor including a plurality of channel formation regions can be formed when needed.

Hereinafter, a process for manufacturing the thin film transistor 110 over a substrate 100 is described with reference to FIGS. 1A to 1E.

First, a conductive film is formed over the substrate 100 having an insulating surface, and a first photolithography step is performed, so that a gate electrode layer 101 is formed. It is preferable that the gate electrode layer be formed to have an end portion in a tapered shape because coverage with a gate insulating layer stacked over the gate electrode layer is improved. Note that a resist mask may be formed by an inkjet method. Formation of the resist mask by an inkjet method needs no photomask; thus, manufacturing cost can be reduced.

Although there is no particular limitation on a substrate which can be used as the substrate 100 having an insulating surface, it is necessary that the substrate have at least enough heat resistance to withstand heat treatment performed later. As the substrate 100 having an insulating surface, a glass substrate formed of barium borosilicate glass, aluminoborosilicate glass, or the like can be used.

In the case where the temperature at which the heat treatment is to be performed later is high, the preferable glass substrate is a glass substrate whose strain point is higher than or equal to 730° C. As a glass substrate, a glass material such as aluminosilicate glass, aluminoborosilicate glass, or barium borosilicate glass is used, for example. Note that more practical glass with heat resistance can be obtained when it contains a larger amount of barium oxide (BaO) than boron oxide. Therefore, a glass substrate containing a larger amount of BaO than $B_2O_3$ is preferably used.

Note that instead of the above glass substrate, a substrate formed of an insulator such as a ceramic substrate, a quartz substrate, or a sapphire substrate may be used. Alternatively, crystallized glass or the like may be used. Further, a plastic substrate or the like can be used as appropriate.

An insulating film serving as a base film may be provided between the substrate 100 and the gate electrode layer 101. The base film has a function of preventing diffusion of an impurity element from the substrate 100, and can be formed to have a single layer or stacked structure using one or more films selected from a silicon nitride film, a silicon oxide film, a silicon nitride oxide film, and a silicon oxynitride film.

The gate electrode layer 101 can be formed with a single layer or a stacked layer using a metal material such as molybdenum, titanium, chromium, tantalum, tungsten, aluminum, copper, neodymium, or scandium, or an alloy material which contains any of these materials as a main component.

For example, as a two-layer structure of the gate electrode layer 101, the following structures are preferable: a two-layer structure of an aluminum layer and a molybdenum layer stacked thereover, a two-layer structure of a copper layer and a molybdenum layer stacked thereover, a two-layer structure of a copper layer and a titanium nitride layer or a tantalum nitride layer stacked thereover, and a two-layer structure of a titanium nitride layer and a molybdenum layer. As a three-layer structure, a stack of a tungsten layer or a tungsten nitride layer, a layer of an alloy of aluminum and silicon or an alloy of aluminum and titanium, and a titanium nitride layer or a titanium layer; or a stack of a molybdenum layer, an aluminum layer, and a molybdenum layer can be formed. Note that the gate electrode layer can be formed from a light-transmitting conductive film. Examples of a material of the light-transmitting conductive film can include a light-transmitting conductive oxide and the like.

Next, a gate insulating layer 102 is formed over the gate electrode layer 101. In order to suppress variation in electric characteristics of the thin film transistor including an oxide semiconductor layer, the thickness of the gate insulating layer 102 is controlled to be equal to or larger than 100 nm and equal to or smaller than 350 nm.

The gate insulating layer 102 can be formed to have a single layer or a stacked layer using any of a silicon oxide layer, a silicon nitride layer, a silicon oxynitride layer, a silicon nitride oxide layer, and an aluminum oxide layer, by a plasma CVD method, a sputtering method, or the like. Note that the gate insulating layer 102 is preferably formed by a sputtering method in order not to include a large amount of hydrogen. When a silicon oxide film is formed by a sputtering method, a target to be used is a silicon target or a quartz target and a sputtering gas to be used is an oxygen gas or a mixed gas of oxygen and argon.

The gate insulating layer 102 can have a stacked structure in which a silicon nitride layer and a silicon oxide layer are stacked over the gate electrode layer 101 in this order. For example, by a sputtering method, a silicon nitride layer ($SiN_y$ (y>0)) with a thickness from 50 nm to 200 nm inclusive is formed as a first gate insulating layer, and a silicon oxide layer ($SiO_x$ (x>0)) with a thickness from 5 nm to 300 nm inclusive is formed as a second gate insulating layer over the first gate insulating layer, so that a gate insulating layer with a thickness of 200 nm is formed.

Alternatively, the gate insulating layer 102 can be a silicon oxide layer. Further alternatively, the gate insulating layer 102 can have a stacked structure in which a silicon nitride layer and a silicon oxide layer are stacked in this order over the gate electrode layer 101. For example, a silicon oxide layer with a thickness of 100 nm, or a stacked layer in which a 100-nm-thick silicon nitride layer and a 100-nm-thick silicon oxide layer are stacked in this order over the gate electrode layer 101 may be used.

When the thickness of the gate insulating layer is controlled to be equal to or larger than 100 nm and equal to or smaller than 350 nm, a thin film transistor can have such stable electric characteristics that the difference of the threshold voltage value is 1V (±1V) or less, between before and after performance of a measurement in which a voltage of 30 V or −30 V is applied to the gate electrode layer (i.e., the gate voltage Vg is 30 V or −30 V) at a temperature of 85° C. for 12 hours.

In order to prevent the gate insulating layer 102 from including hydrogen, hydroxyl, and moisture as much as possible, it is preferable that an impurity attached on the substrate 100 be removed by heating the substrate 100 over which the gate electrode layer 101 is formed at a temperature of 200° C. or higher in a preheat chamber of a sputtering apparatus, as a pretreatment of film formation.

Next, an oxide semiconductor film 120 having a thickness from 2 nm to 200 nm inclusive is formed over the gate insulating layer 102 (see FIG. 1A).

Note that before the oxide semiconductor film 120 is formed by a sputtering method, dust on a surface of the gate insulating layer 102 is preferably removed by reverse sputtering in which an argon gas is introduced and plasma is generated. The reverse sputtering refers to a method in which, without application of a voltage to a target side, a voltage is applied to a substrate side using an RF power source in an argon atmosphere so that the substrate surface is exposed to plasma to be modified. Note that instead of an argon atmosphere, a nitrogen atmosphere, a helium atmosphere, an oxygen atmosphere, or the like may be used.

The oxide semiconductor film 120 is formed by a sputtering method. The oxide semiconductor film 120 is formed using any of the following films: an In—Ga—Zn—O-based film; an In—Sn—Zn—O-based oxide semiconductor film; an In—Al—Zn—O-based oxide semiconductor film; a Sn—Ga—Zn—O-based oxide semiconductor film; an Al—Ga—Zn—O-based oxide semiconductor film; a Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. In this embodiment, the oxide semiconductor film 120 is formed by a sputtering method with the use of an In—Ga—Zn—O-based metal oxide target. Further, the oxide semiconductor film 120 can be formed by a sputtering method in an atmosphere of a sputtering gas, such as a rare gas (typically argon) atmosphere, an oxygen atmosphere, or an atmosphere of a rare gas (typically argon) and oxygen. In the case of performing a sputtering method, a target including $SiO_2$ at equal to or greater than 2 wt % and equal to or less than 10 wt % may be used.

As a sputtering gas used in depositing the oxide semiconductor film 120, a high-purity gas is preferably used, in which an impurity such as hydrogen, water, hydroxyl or hydride is reduced to such a degree that the impurity concentration level is represented by the unit "ppm" or "ppb".

As a target used in a sputtering method for deposition of the oxide semiconductor film 120, a metal oxide target containing zinc oxide as a main component can be used. Another example of metal oxide target can be a metal oxide target containing In, Ga, and Zn (with a composition ratio of $In_2O_3:Ga_2O_3:ZnO=1:1:1$ [molar ratio] or In:Ga:Zn=1:1:0.5 [atomic ratio]). Alternatively, as a metal oxide target containing In, Ga, and Zn, a target having such composition ratio as In:Ga:Zn=1:1:1 [atomic ratio] or In:Ga:Zn=1:1:2 [atomic ratio] can be used. In addition, the filling factors of the metal oxide target is 90% to 100% inclusive, preferably, 95% to 99.9% inclusive. An oxide semiconductor film to be formed becomes a dense film with the use of a metal oxide target having a high filling factor.

The substrate is placed in a treatment chamber kept in a reduced pressure state, and is heated to a temperature equal to or higher than room temperature and lower than 400° C. Residual moisture in the treatment chamber is removed, and a sputtering gas in which hydrogen and moisture are removed is introduced. With use of metal oxide as a target, deposition of the oxide semiconductor film 120 is performed over the substrate 100. An adsorption vacuum pump is preferably used for removing residual moisture in the treatment chamber. For example, a cryopump, an ion pump, or a titanium sublimation pump is preferably used. As an evacuation unit, a turbo-molecular pump provided with a cold trap may be used. In the treatment chamber evacuated by using a cryopump, a hydrogen atom, a compound including a hydrogen atom, such as $H_2O$, a compound including a carbon atom, and the like are eliminated; thus, the concentration of an impurity included in the oxide semiconductor film formed in the treatment chamber can be reduced.

As an example of a deposition condition, the distance between the substrate and the target is 100 mm, the pressure is 0.6 Pa, the direct current (DC) power supply is 0.5 kW, and an atmosphere of deposition is an oxygen (the proportion of oxygen flow is 100%) atmosphere. Note that a pulse direct current (DC) power supply is preferable because powder substances (also referred to as particles or dust) generated in the film formation can be reduced and the film thickness can be made uniform. The preferable thickness of the oxide semiconductor film is from 5 nm to 30 nm inclusive. Note that the preferable thickness varies depends on an oxide semiconductor material; thus, the appropriate thickness may be determined depending on a material.

When the oxide semiconductor film 120 is formed by a sputtering method in the above manner, the hydrogen concentration quantified by secondary ion mass spectrometry (SIMS) can be reduced to $5\times10^{19}/cm^3$ or lower, preferably $1\times10^{19}/cm^3$ or lower (further preferably, $5\times10^{18}$ $cm^{-3}$ or lower).

Deposition of the oxide semiconductor film 120 is performed under such a sputtering condition that the film is not damaged during deposition. When the substrate temperature at deposition is set to a temperature equal to or higher than room temperature and lower than 400° C., alteration of the oxide semiconductor film (e.g., in the case of an In—Ga—Zn—O-based film, deposition of Zn outside the film) caused by heat treatment at high temperature can be prevented.

Examples of a sputtering method include an RF sputtering method in which a high-frequency power source is used for a sputtering power supply, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

Further, as a deposition method using a sputtering method, a reactive sputtering method in which a target substance and a sputtering gas component are chemically reacted with each other during deposition to form a thin compound film thereof, or a bias sputtering method in which a voltage is also applied to a substrate during deposition can be used.

Figure 1B:
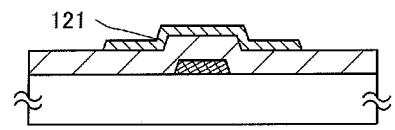

Next, the oxide semiconductor film is processed into an island-shaped oxide semiconductor layer 121 by a second photolithography step (see FIG. 1B). A resist mask used for formation of the island-shaped oxide semiconductor layer 121 may be formed by an inkjet method. Formation of the resist mask by an inkjet method needs no photomask; thus, manufacturing cost can be reduced.

In the case where a contact hole is formed in the gate insulating layer 102, a formation step of the contact hole can be performed together with formation of the oxide semiconductor layer 121.

Note that etching of the oxide semiconductor film 120 performed at this time may be wet etching, dry etching, or both dry etching and wet etching.

As the etching gas for dry etching, a gas containing chlorine (chlorine-based gas such as chlorine ($Cl_2$), boron chloride ($BCl_3$), silicon chloride ($SiCl_4$), or carbon tetrachloride ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBO; oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (a hydrogen peroxide solution at 31 wt %: an ammonia solution at 28 wt %:water=5:2:2), or the like can be used. In addition, ITO07N (produced by KANTO CHEMICAL CO., INC.) may also be used.

After the wet etching, the etchant is removed together with the etched materials by cleaning. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Note that it is preferable that reverse sputtering be performed before formation of a conductive film in the subsequent step, so that a resist residue or the like, attached on the surfaces of the oxide semiconductor layer 121 and the gate insulating layer 102 is removed.

Next, a conductive film is formed over the gate insulating layer 102 and the oxide semiconductor layer 121. The conductive film may be formed by a sputtering method or a vacuum evaporation method. As a material of the conductive film, an element selected from Al, Cr, Cu, Ta, Ti, Mo, and W; an alloy containing any of these elements as a component; an alloy film containing any of these elements in combination; and the like can be given. Alternatively, one or more materials selected from manganese, magnesium, zirconium, and beryllium may be used. Further, the metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, an alloy film containing aluminum and one or more elements selected from titanium (Ti), tantalum (Ta), tungsten (W), molybdenum (Mo), chromium (Cr), neodymium (Nd), or scandium (Sc), or a nitride film containing one or more of these elements may be used.

By a third photolithography step, a resist mask is formed over the conductive film, and etching is selectively performed, so that a source electrode layer 115a and a drain electrode layer 115b are formed. Then, the resist mask is removed (see FIG. 1C).

Note that the materials and etching conditions are adjusted as appropriate so that the oxide semiconductor layer 121 is not removed by etching of the conductive film.

In this embodiment, a Ti film is used as the conductive film, and an In—Ga—Zn—O-based oxide is used for the oxide semiconductor layer 121. As an etchant, an ammonium hydroxide/hydrogen peroxide mixture (a 31 wt % hydrogen peroxide solution: 28 wt % ammonia water: water=5:2:2) is used.

By the third photolithography step, only part of the oxide semiconductor layer 121 may be etched off, whereby an oxide semiconductor layer having a groove (a depressed portion) may be formed. Note that a resist mask used for forming the source electrode layer 115a and the drain electrode layer 115b may be formed by an ink jetting method. Formation of the resist mask by an inkjet method needs no photomask; thus, manufacturing cost can be reduced.

In order to reduce the number of photomasks and steps in the photolithography step, etching may be performed with use of a resist mask formed using a multi-tone mask which is a light-exposure mask through which light is transmitted so as to have a plurality of intensities. Since a resist mask formed using a multi-tone mask has a plurality of thicknesses and can be further changed in shape by performing etching, the resist mask can be used in a plurality of etching steps to provide different patterns. Therefore, a resist mask corresponding to at least two kinds of different patterns can be formed by using a multi-tone mask. Thus, the number of light-exposure masks can be reduced and the number of corresponding photolithography steps can be also reduced, whereby simplification of a process can be realized.

By plasma treatment with use of a gas of $N_2O$, $N_2$, Ar, or the like, adsorbed water and the like on an exposed surface of the oxide semiconductor layer may be removed. Further, plasma treatment may be performed with use of a mixed gas of oxygen and argon.

In the case of performing plasma treatment, a silicon oxide layer 116 is formed as an oxide insulating layer functioning as a protective insulating film which is in contact with part of the oxide semiconductor layer without being exposed to air. In this embodiment, the silicon oxide layer 116 is formed to be in contact with a part of the oxide semiconductor layer 121 which does not overlap with the source electrode layer 115a and the drain electrode layer 115b.

As the silicon oxide layer 116, a silicon oxide layer including defects is formed in the following manner: the substrate 100 over which the island-shaped oxide semiconductor layer 121, the source electrode layer 115a, and the drain electrode layer 115b are formed is heated to a temperature equal to or higher than room temperature and lower than 100° C.; a sputtering gas including high-purity oxygen, from which hydrogen and moisture are removed, is introduced; and a silicon semiconductor target is used. Note that the silicon oxide layer 116 is formed to be a silicon oxide ($SiO_x$ where x is preferably equal to or larger than 2) layer.

As a sputtering gas used in depositing the silicon oxide layer 116, a high-purity gas is preferably used, in which an impurity such as hydrogen, water, hydroxyl or hydride is reduced to such a degree that the impurity concentration level is represented by the unit "ppm" or "ppb".

For example, a silicon oxide film is formed by a pulsed DC sputtering method with use of a boron-doped silicon target which has a purity of 6N (99.9999%) and a resistivity of 0.01 Ω·cm, in which the distance between the substrate and the target (T-S distance) is 89 mm, the pressure is 0.4 Pa, the direct-current (DC) power source is 6 kW, and the atmosphere is an oxygen atmosphere (the proportion of oxygen flow is 100%). The film thickness thereof is 300 nm. Note that instead of a silicon target, quartz (preferably, synthetic quartz) can be used as a target for depositing the silicon oxide film. As a sputtering gas, an oxygen gas or a mixed gas of oxygen and argon is used.

In this case, deposition of the silicon oxide layer 116 is preferably performed while the residual moisture in the treatment chamber is removed, in order to prevent inclusion of hydrogen, hydroxyl, or moisture in the oxide semiconductor layer 121 and the silicon oxide layer 116.

Instead of the silicon oxide layer, a silicon oxynitride layer, an aluminum oxide layer, an aluminum oxynitride layer, or the like can be used.

Next, heat treatment is performed at a temperature of 100° C. to 400° C. in such a condition that the silicon oxide layer 116 including defects and the oxide semiconductor layer 121 are in contact with each other. By this heat treatment, hydrogen or moisture included in the oxide semiconductor layer 121 can be diffused into the silicon oxide layer 116 including defects. Since the silicon oxide layer 116 includes many defects (dangling bonds), the impurity such as hydrogen, hydroxyl, or moisture included in the oxide semiconductor layer 121 is diffused into the silicon oxide layer 116 through an interface between the oxide semiconductor layer 121 and the silicon oxide layer 116. Specifically, a hydrogen atom, a compound including a hydrogen atom, such as $H_2O$, a compound including a carbon atom, and the like included in the oxide semiconductor layer 121 become easy to diffuse and transfer into the silicon oxide layer 116.

In terms of diffusion of hydrogen from the oxide semiconductor layer into the silicon oxide layer, calculation was performed to examine in which of an oxide semiconductor layer (amorphous IGZO) or a silicon oxide layer (amorphous $SiO_x$) hydrogen atoms are more likely to exist.

A binding energy of a hydrogen atom E_bind was defined as follows, so that stability of the hydrogen atom in an environment was evaluated.

$$E\_bind = \{E(\text{original structure}) + E(H)\} - E(\text{structure with } H)$$

The larger this binding energy E_bind becomes, the more likely the hydrogen atom is to exist. E(original structure), E(H), and E(structure with H) respectively represent energy of the original structure, energy of the hydrogen atom, and energy of the structure with H. The binding energy of four samples was calculated: amorphous IGZO, amorphous $SiO_2$ without dangling bonds (hereinafter abbreviated to DB), and two kinds of amorphous $SiO_x$ with DB.

For calculation, CASTEP, which is a calculation program for a density functional theory, was used. As a method for the density functional theory, a plan wave basis pseudopotential method was used. As a functional, LDA was used. Cut-off energy was set at 300 eV. K-point was set to be a grid of 2×2×2.

The calculated structures are described below. First, the original structure is described. A unit cell of amorphous IGZO includes 84 atoms in total: 12 In atoms, 12 Ga atoms, 12 Zn atoms, and 48 O atoms. A unit cell of amorphous $SiO_2$ without DB includes 48 atoms in total: 16 Si atoms and 32 O atoms. Amorphous $SiO_x$ with DB (1) has such a structure that an O atom is removed from the amorphous $SiO_2$ without DB and one atom of Si which has been bonded to the O atom is bonded to a H atom; that is, it includes 48 atoms in total: 16 Si atoms, 31 O atoms, and one H atom. Amorphous $SiO_x$ with DB (2) has such a structure that a Si atom is removed from the amorphous $SiO_2$ without DB and three atoms of O which have been bonded to the Si atom are bonded to H atoms; that is, it includes 50 atoms in total: 15 Si atoms, 32 O atoms, and 3 H atoms. The structure with H is a structure in which H was attached to each of the above four structures.

Note that H was attached to an O atom in the amorphous IGZO, a Si atom in the amorphous $SiO_2$ without DB, and an atom that has DB in the amorphous $SiO_x$ with DB. The structure in which H was calculated includes one H atom in a unit cell. Note that the cell size of each structure is shown in Table 1.

TABLE 1

| Structure | Cell Size (nm) Angle |
|---|---|
| Amorphous IGZO | 1.0197 × 1.0197 × 1.0197 |
|  | α = β = γ = 90° |
| Amorphous $SiO_2$ without DB | 0.9127 × 0.9127 × 0.9127 |
| Amorphous $SiO_x$ (1) with DB | α = β = γ = 90° |
| Amorphous $SiO_x$ (2) with DB |  |
| H atom | 1.0000 × 1.0000 × 1.0000 |
|  | α = β = γ = 90° |

Calculation results are shown in Table 2.

TABLE 2

| | Energy of the structure with H atom (eV) | Energy of the original structure (eV) | Energy of a hydrogen atom (eV) | Binding energy (eV) |
|---|---|---|---|---|
| Amorphous IGZO | −84951.3359 | −84935.6442 | −13.0015 | 2.69 |
| Amorphous $SiO_2$ without DB | −15783.8101 | −15770.6279 | −13.0015 | 0.18 |
| Amorphous $SiO_x$ (1) with DB | −15363.1459 | −15345.6884 | −13.0015 | 4.46 |
| Amorphous $SiO_x$ (2) with DB | −15722.2053 | −15702.5905 | −13.0015 | 6.61 |

From the above, amorphous $SiO_x$ with DB (2) having a structure in which a Si atom is removed from the amorphous $SiO_2$ without DB and three atoms of O which have been bonded to the Si atom are bonded to H atoms has the maximum binding energy, followed by $SiO_x$ (1) having a structure in which an O atom is removed from the amorphous $SiO_2$ without DB and one atom of Si which has been bonded to the O atom is bonded to a H atom, amorphous IGZO, and amorphous $SiO_2$ without DB having the minimum binding energy. Therefore, hydrogen becomes the most stable when being bonded to DB in amorphous $SiO_x$.

As a result, the following process can be assumed. There is a large amount of DBs in amorphous $SiO_x$. A hydrogen atom diffusing at the interface between amorphous IGZO and amorphous $SiO_x$ becomes stable by being bonded to the DB in the amorphous $SiO_x$. Thus, the hydrogen atom in the amorphous IGZO transfers to the DB in the amorphous $SiO_x$.

From the fact that the amorphous $SiO_x$ with DB (2) having the structure in which dangling bonds are formed by removal of Si has a higher binding energy than the $SiO_x$ with DB (1) having the structure in which a dangling bond is formed by removal of O, a hydrogen atom is more stable in $SiO_x$ when being bonded to O. Accordingly, x of $SiO_x$ is preferably larger than or equal to 2.

If the silicon oxide layer including defects is a silicon oxide layer including many oxygen dangling bonds as defects, the binding energy with respect to hydrogen is high; accordingly, more hydrogen or more impurities including hydrogen can be diffused from the oxide semiconductor layer into the silicon oxide layer including defects. Therefore, x in $SiO_x$ is preferably larger than or equal to 2.

Figure 1C:
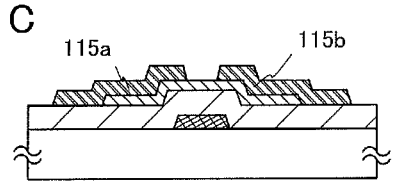
Figure 1D:
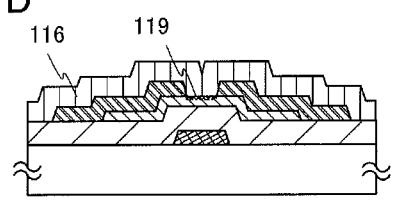

When the silicon oxide layer 116 is formed in contact with the oxide semiconductor layer 121, a mixed region 119 including an oxide semiconductor and silicon oxide is formed at an interface between the oxide semiconductor layer and the silicon oxide layer (see FIG. 1D).

The mixed region 119 includes oxygen, silicon, and at least one kind of metal element that is included in the oxide semiconductor. For example, in the case of using an In—Ga—Zn—O-based oxide as the oxide semiconductor, the mixed region includes silicon, oxygen, and at least one kind of metal element among In, Ga, and Zn. Assuming that the metal included in the oxide semiconductor in the mixed region is M, M and H exist in a variety of states such as M-OH, M-H, M-O—Si—H, and M-O—Si—OH. As specific examples, Zn—H, Zn—OH, and the like can be given.

The thickness of the mixed region is 1 nm to 10 nm, preferably 2 nm to 5 nm. The thickness of the mixed region can be controlled by the film formation conditions of the sputtering method at the time of forming the silicon oxide layer. If the power supply is set higher and the distance between the substrate and the target is set shorter in the sputtering method, the mixed region can be formed thicker. When the sputtering method is conducted with higher power supply, water adsorbed on a surface of the oxide semiconductor layer or the like can be removed.

Provision of the mixed region 119 between the oxide semiconductor layer 121 and the silicon oxide layer 116 promotes a hydrogen atom, a compound including a hydrogen atom such as $H_2O$, a compound including a carbon atom, or the like included in the oxide semiconductor layer 121 to be diffused into the silicon oxide layer 116; thus, transfer thereof becomes easier.

The above steps enable the impurity such as hydrogen or moisture to be removed and the interface between the oxide semiconductor layer 121 and the oxide semiconductor layer 116 to have a hydrogen concentration of $5×10^{19}/cm^3$ or lower, preferably $1×10^{19}/cm^3$ or lower. By reducing the concentration of the impurity such as hydrogen or moisture as much as possible, generation of parasitic channel on the back channel side, i.e., in a superficial portion of the oxide semiconductor layer can be suppressed.

Figure 1E:
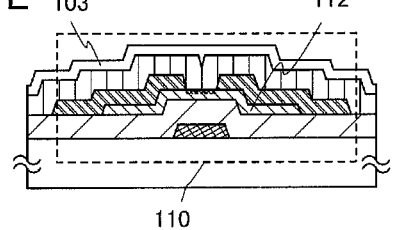

Therefore, the thin film transistor 110 including the oxide semiconductor layer 112 in which the concentration of hydrogen and hydride is reduced can be manufactured (see FIG. 1E).

When residual moisture in the reaction atmosphere is removed at the time of the above-described formation of the oxide semiconductor film, the concentration of hydrogen and hydride in the oxide semiconductor film can be reduced. Accordingly, the oxide semiconductor film can be stabilized.

A protective insulating layer may be provided over the oxide insulating layer. In this embodiment, a protective insulating layer 103 is formed over the silicon oxide layer 116. As the protective insulating layer 103, a silicon nitride film, a silicon nitride oxide film, an aluminum nitride film, or the like can be used.

As the protective insulating layer 103, a silicon nitride film is formed by heating the substrate 100 over which layers up to the silicon oxide layer 116 are formed, to a temperature of 100° C. to 400° C., introducing a sputtering gas containing high-purity nitrogen from which hydrogen and moisture are removed, and using a target of a silicon semiconductor. In this case also, it is preferable that residual moisture be removed from the treatment chamber in the formation of the protective insulating layer 103 in a manner similar to that of the silicon oxide layer 116.

In the case of forming the protective insulating layer 103, the substrate 100 is heated to a temperature of 100° C. to 400° C. at the time of deposition of the protective insulating layer 103, whereby hydrogen or moisture included in the oxide semiconductor layer can be diffused into the oxide insulating layer (the silicon oxide film including defects). In such a case, heat treatment after the formation of the silicon oxide layer 116 is unnecessary.

In the case where the silicon oxide layer 116 and a silicon nitride layer as the protective insulating layer 103 are stacked, the silicon oxide layer and the silicon nitride layer can be formed in the same treatment chamber using a common silicon target. First, a sputtering gas containing oxygen is introduced and the silicon oxide layer is formed using a silicon target placed inside the treatment chamber, and then the sputtering gas is switched to a sputtering gas containing nitrogen and the silicon nitride layer is formed using the same silicon target. Since the silicon oxide layer and the silicon nitride layer can be formed in succession without exposure to the air, an impurity such as hydrogen or moisture can be prevented from being adsorbed on a surface of the silicon oxide layer. In this case, after the silicon oxide layer 116 and the silicon nitride layer as the protective insulating layer 103 are stacked, heat treatment (at a temperature of 100° C. to 400° C.) for diffusing hydrogen or moisture included in the oxide semiconductor layer into the oxide insulating layer (the silicon oxide film including defects) may be performed.

After the formation of the protective insulating layer, heat treatment may be further performed at 100° C. to 200° C. inclusive in the air for 1 hour to 30 hours inclusive. This heat treatment may be performed at a fixed heating temperature. Alternatively, the following change in the heating temperature may be conducted plural times repeatedly: the heating temperature is increased from room temperature to a temperature of 100° C. to 200° C. and then decreased to room temperature. Further, this heat treatment may be performed before formation of the oxide insulating film under a reduced pressure. Under the reduced pressure, the heat treatment time can be shortened. With this heat treatment, a normally-off thin film transistor can be obtained. Therefore, reliability of the semiconductor device can be improved.

When the silicon nitride layer is formed over the silicon oxide layer including defects under the state of heating the substrate, hydrogen or moisture can be diffused from the oxide semiconductor film to the silicon oxide film, and at the same time, the barrier film which prevents entry of moisture from the outside air can be provided.

When residual moisture in the reaction atmosphere is removed at the time of the formation of the oxide semiconductor layer, in which a channel formation region is to be formed, over the gate insulating layer, the concentration of hydrogen and hydride in the oxide semiconductor layer can be reduced. Further, when the silicon oxide layer including defects is provided so as to be in contact with the oxide semiconductor layer, hydrogen or moisture in the oxide semiconductor layer can be diffused into the silicon oxide film and the concentration of hydrogen and a hydrogen compound in the oxide semiconductor layer can be reduced.

The above-described process can be used for manufacturing a backplane (a substrate over which a thin film transistor is formed) of a liquid crystal display panel, an electroluminescent display panel, a display device using electronic ink, or the like. Since the above-described process is performed at a temperature lower than or equal to 400° C., the process can be applied to a manufacturing process using a glass substrate having a side longer than or equal to 1 meter and a thickness less than or equal to 1 millimeter. Since the whole process can be performed at a treatment temperature lower than or equal to 400° C., a display panel can be manufactured without consuming too much energy.

Figure 3:
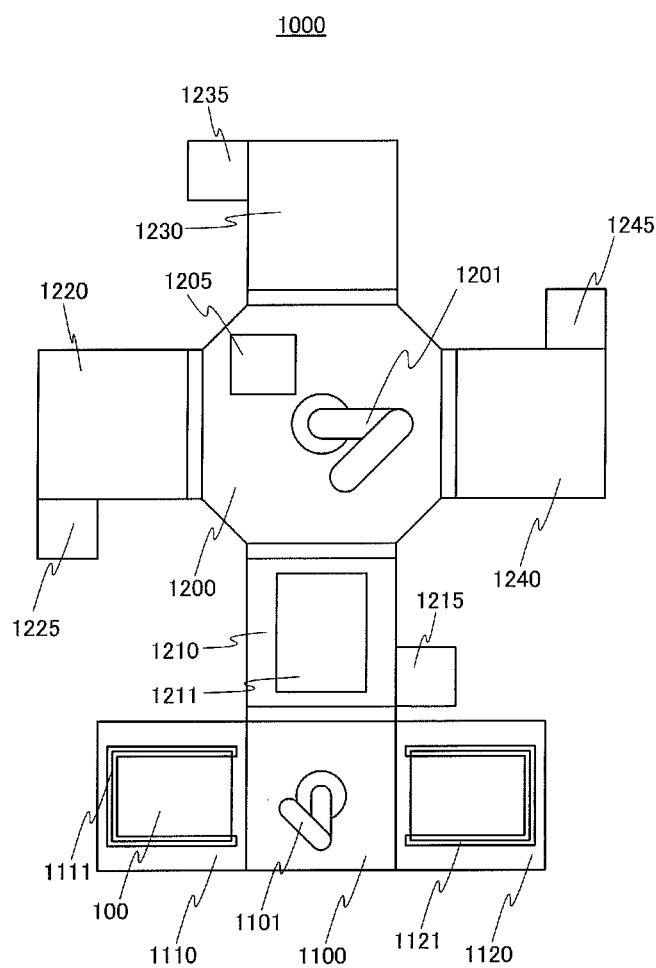
FIG. 3 illustrates an example of a structure of a film formation apparatus.

FIG. 3 illustrates an example of a film formation apparatus 1000 that can be used for forming an oxide semiconductor film and for manufacturing a semiconductor device in which an oxide semiconductor film is used.

The film formation apparatus 1000 includes a loading chamber 1110 and an unloading chamber 1120. The loading chamber 1110 and the unloading chamber 1120 are respectively provided with a cassette 1111 which stores a substrate before being treated and a cassette 1121 which stores the treated substrate. A first transfer chamber 1100 is provided between the loading chamber 1110 and the unloading chamber 1120, and is provided with a transfer unit 1101 which transfers a substrate 100.

In addition, the film formation apparatus 1000 includes a second transfer chamber 1200. The second transfer chamber 1200 is provided with a transfer unit 1201 and connected to four surrounding treatment chambers (a first treatment chamber 1210, a second treatment chamber 1220, a third treatment chamber 1230, and a fourth treatment chamber 1240) through gate valves. Note that one side of the first treatment chamber 1210 is connected to the first transfer chamber 1100 through a gate valve, and the other side of the first treatment chamber 1210 is connected to the second transfer chamber 1200 through a gate valve.

The second transfer chamber 1200, the first treatment chamber 1210, the second treatment chamber 1220, the third treatment chamber 1230, and the fourth treatment chamber 1240 are respectively provided with an evacuation unit 1205, an evacuation unit 1215, an evacuation unit 1225, an evacuation unit 1235, and an evacuation unit 1245. Although the evacuation unit may be selected in accordance with the use application of each treatment chamber, an evacuation unit such as a cryopump is particularly preferable. Alternatively, a turbo molecular pump provided with a cold trap may be used.

In the case where the oxide semiconductor film is formed, an evacuation unit such as a cryopump is preferably used in order to prevent entry of an impurity of moisture left in the treatment chamber in steps before and after formation of films in contact with the oxide semiconductor film and steps before and after formation of the oxide semiconductor film, and needless to say, in the treatment chamber for forming the oxide semiconductor film.

A substrate heating unit 1211 is provided in the first treatment chamber 1210. The first treatment chamber 1210 serves as a delivery chamber for transferring a substrate from the first transfer chamber 1100 in an atmospheric pressure state into the second transfer chamber 1200 in a reduced pressure state. By provision of the delivery chamber, the second transfer chamber 1200 can be prevented from being contaminated by air.

The second treatment chamber 1220, the third treatment chamber 1230, and the fourth treatment chamber 1240 are provided with a structure for forming a silicon nitride film using a sputtering method, a structure for forming a silicon oxide film using a sputtering method, and a structure for forming an oxide semiconductor film using a sputtering method, respectively. In other words, each of the treatment chambers is provided with a target and a substrate heating unit, and a gas supply unit with which a sputtering gas is introduced and a glow discharge generation unit are added to each of the chamber.

An operation example of the film formation apparatus 1000 will be described. Here, a method for successively forming a gate insulating layer and an oxide semiconductor layer over a substrate over which the gate electrode layer 101 is formed, as illustrated in FIG. 1A will be described.

The transfer unit 1101 transfers the substrate 100, over which the gate electrode layer 101 is formed, from the cassette 1111 to the first treatment chamber 1210. Then, the gate valve is closed and the substrate 100 is preheated in the first treatment chamber 1210 to eliminate an impurity adsorbed on the substrate and evacuation is performed. The impurity, for example, includes a hydrogen atom, a compound including a hydrogen atom, such as $H_2O$, a compound including a carbon atom, or the like.

Next, the substrate 100 is transferred to the second treatment chamber 1220, and a silicon nitride film is formed. Then, the substrate 100 is transferred to the third treatment chamber 1230, and a silicon oxide film is formed. Thus, the gate insulating layer 102 is formed. It is preferable that evacuation be performed in the second treatment chamber 1220 and the third treatment chamber 1230 using a cryopump or the like so that the impurity concentration in the film formation chambers is reduced. The silicon nitride film and the silicon oxide film that are stacked in the treatment chambers in which the impurity is reduced are used as the gate insulating layer 102 in which hydrogen, hydroxyl, moisture, or the like contained is suppressed.

Then, the substrate 100 is transferred to the fourth treatment chamber 1240. The fourth treatment chamber 1240 is provided with a target for an oxide semiconductor and includes a cryopump as an evacuation unit. In the fourth treatment chamber 1240, an oxide semiconductor layer is formed.

Figure 2:
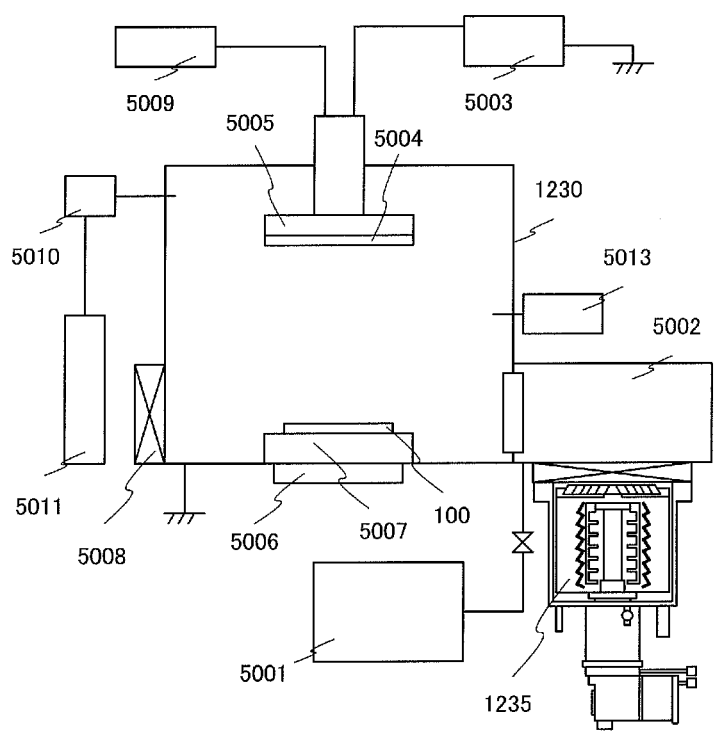
FIG. 2 illustrates an example of a structure of a film formation apparatus.

A method for forming the oxide semiconductor film 120 in the fourth treatment chamber 1240 will be described with reference to FIG. 2. As illustrated in FIG. 2, the fourth treatment chamber 1240 is connected to the evacuation unit 1245 through an evacuation chamber 5002 with the use of a main valve. The fourth treatment chamber 1240 includes a power supply 5003, a dry pump 5001, a cathode 5005, a stage elevator 5006, a substrate stage 5007, a gate valve 5008, cooling water 5009, a flow rate controller 5010, and a gas tank 5011. The substrate 100 is held over the substrate stage 5007, and a target 5004 for an oxide semiconductor is placed on the cathode 5005 side.

First, evacuation of the fourth treatment chamber 1240 is performed using the dry pump 5001 through the evacuation chamber 5002, so that the pressure inside the fourth treatment chamber 1240 is reduced. Then, further evacuation is performed with the evacuation unit 1245 which is a cryopump, so that an impurity such as hydrogen, moisture, hydride, or a hydrogen compound inside the fourth treatment chamber 1240 is eliminated. Instead of the cryopump, a turbo molecular pump may be used; in that case, a cold trap for adsorbing moisture or the like may be provided above an inlet of the turbo molecular pump.

The substrate 100, over which layers up to the gate insulating layer 102 are formed, is transferred to the fourth treatment chamber 1240 through the gate valve 5008 and held over the substrate stage 5007. A sputtering gas is introduced from the gas tank 5011 into the fourth treatment chamber 1240 with the flow rate controlled by the flow rate controller 5010, voltage is applied to the cathode 5005 by the power supply 5003 so that plasma is generated, and the target 5004 is used; thus, the oxide semiconductor film 120 is formed over the substrate 100.

Although the fourth treatment chamber has been described as an example with reference to FIG. 2, the method of FIG. 2 can be applied to any treatment chamber of the film formation apparatus in this specification as appropriate.

Since residual moisture is removed from the fourth treatment chamber 1240 with the use of the cryopump, the hydrogen concentration in the oxide semiconductor film 120 can be reduced. In addition, the substrate is heated during the deposition of the oxide semiconductor film 120. When deposition by sputtering is performed while removing residual moisture left in the treatment chamber with a cryopump, the substrate temperature at the time of forming the oxide semiconductor film 120 can be equal to or higher than room temperature and lower than 400° C.

In the above-described manner, the gate insulating layer 102 and the oxide semiconductor film 120 can be successively formed in the film formation apparatus 1000. Note that although the structure in which three or more treatment chambers are connected through the transfer chamber is illustrated in FIG. 3, the present invention is not limited thereto. For example, a so-called in-line structure, in which a carry-in entrance and a carry-out exit for a substrate are provided for each treatment chamber and the treatment chambers are connected in series, may be employed.

Figure 4:
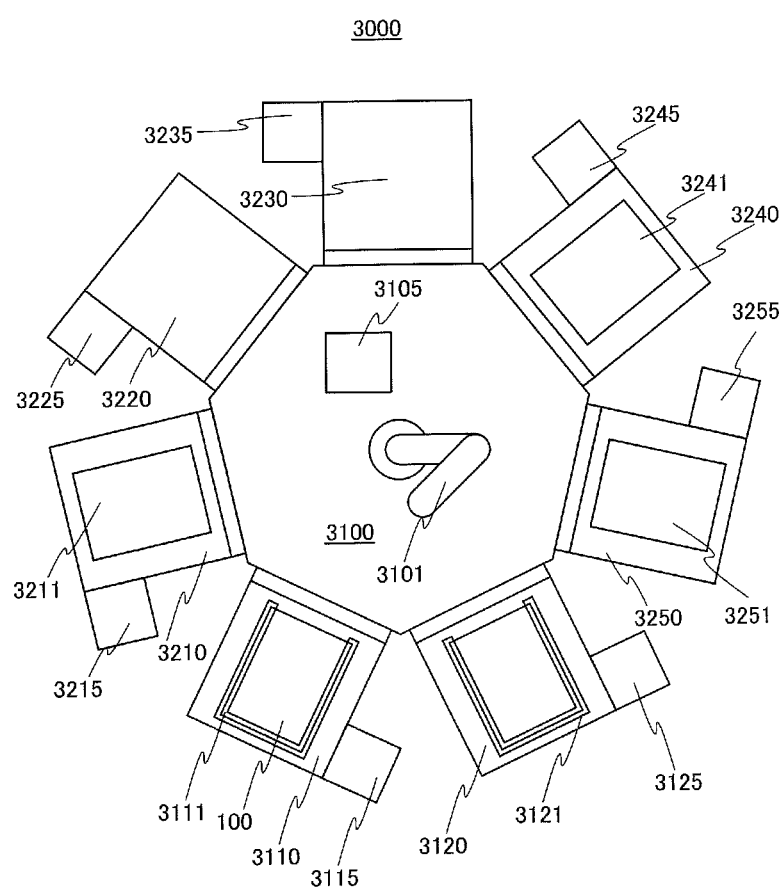
FIG. 4 illustrates an example of a structure of a film formation apparatus.

FIG. 4 illustrates an example of a film formation apparatus 3000 for forming the silicon oxide layer 116 and the protective insulating layer 103 over the island-shaped oxide semiconductor layer 121 as illustrated in FIG. 1C.

The film formation apparatus 3000 includes a loading chamber 3110 and an unloading chamber 3120, which are provided with a cassette 3111 for storing a substrate before being treated and a cassette 3121 for storing the treated substrate, respectively.

In addition, the film formation apparatus 3000 includes a first transfer chamber 3100. The first transfer chamber 3100 is provided with a transfer unit 3101 and connected to five treatment chambers (a first treatment chamber 3210, a second treatment chamber 3220, a third treatment chamber 3230, a fourth treatment chamber 3240, and a fifth treatment chamber 3250) each through a gate valve.

The loading chamber 3110, the unloading chamber 3120, the first transfer chamber 3100, the first treatment chamber 3210, the second treatment chamber 3220, the third treatment chamber 3230, the fourth treatment chamber 3240, and the fifth treatment chamber 3250 are provided with an evacuation unit 3115, an evacuation unit 3125, an evacuation unit 3105, an evacuation unit 3215, an evacuation unit 3225, an evacuation unit 3235, an evacuation unit 3245, and an evacuation unit 3255 respectively, whereby a reduced pressure state can be realized. Although the evacuation unit may be selected in accordance with the use application of each treatment chamber, an evacuation unit such as a cryopump is particularly preferable. Alternatively, a turbo molecular pump provided with a cold trap may be used.

The loading chamber 3110 and the unloading chamber 3120 each serve as a delivery chamber for transferring a substrate to/from the first transfer chamber 3100. By provision of the delivery chamber, the first transfer chamber 3100 can be prevented from being contaminated by air.

The first treatment chamber 3210 and the fourth treatment chamber 3240 are provided with a substrate heating unit 3211 and a substrate heating unit 3241, respectively. The second treatment chamber 3220 and the third treatment chamber 3230 are provided with a structure for forming a silicon oxide film using a sputtering method and a structure for forming a silicon nitride film using a sputtering method, respectively. In other words, each of the treatment chambers is provided with a target and a substrate heating unit, and a gas supply unit with which a sputtering gas is introduced and a glow discharge generation unit are added to each of the chamber. In addition, the fifth treatment chamber 3250 is provided with a cooling unit 3251.

An operation example of the film formation apparatus 3000 will be described. Here, a method for forming the silicon oxide layer 116 and the protective insulating layer 103 over the island-shaped oxide semiconductor layer 121 illustrated in FIG. 1C will be described.

First, evacuation of the loading chamber 3110 is performed, and after the pressure in the loading chamber 3110 become substantially equal to that in the first transfer chamber 3100, the gate valve is opened and the substrate 100 is transferred from the loading chamber 3110 to the first treatment chamber 3210 through the first transfer chamber 3100.

Next, an impurity adsorbed on the substrate 100 is preferably eliminated by preheating the substrate 100 with the substrate heating unit 3211 of the first treatment chamber 3210, and evacuation is preferably performed. Examples of the impurity are a hydrogen atom, a compound including a hydrogen atom such as $H_2O$, a compound including a carbon atom, and the like. The preheat temperature is in the range of from 100° C. to 400° C. inclusive, and preferably in the range of from 150° C. to 300° C. inclusive. As the evacuation unit provided in the first treatment chamber 3210, a cryopump is preferable. Since the impurity adsorbed on the substrate 100 is eliminated by the preheating and diffused into the first treatment chamber 3210, the impurity need to be evacuated from the first treatment chamber 3210 using a cryopump. Note that this preheating treatment can be omitted.

Then, the substrate 100 is transferred to the second treatment chamber 3220, and the silicon oxide layer 116 is formed. For example, a silicon oxide film is formed as the silicon oxide layer 116. Evacuation is performed in the second treatment chamber 3220 using a cryopump or the like, so that the impurity concentration in the film formation chamber is reduced. The oxide insulating film formed in the treatment chamber in which the impurity is reduced has a suppressed impurity concentration. Specifically, the concentration of hydrogen included in the oxide insulating film can be reduced. The silicon oxide layer 116 may be formed while heating the substrate 100, but it is desirable that the silicon oxide layer 116 be formed at a temperature of approximately 0° C. to 50° C., preferably at room temperature so as to include defects.

In the case of forming a silicon oxide film as the silicon oxide layer 116 by a sputtering method, a quartz target or a silicon target can be used as the target, and a silicon target is particularly preferable. A silicon oxide film formed by a sputtering method using a silicon target under an atmosphere of oxygen and a rare gas can include a dangling bond of a silicon atom or an oxygen atom. If the silicon oxide layer 116 including defects includes many oxygen dangling bonds as defects, the binding energy with respect to the impurity such as hydrogen, hydroxyl, or moisture is high; accordingly, a larger amount of hydrogen or impurity including hydrogen can be diffused from the oxide semiconductor layer 121 into the silicon oxide layer including defects.

When the silicon oxide layer 116 including many dangling bonds is provided in contact with the island-shaped oxide semiconductor layer 121, the impurity such as hydrogen, hydroxyl, or moisture included in the island-shaped oxide semiconductor layer 121 can be more easily diffused into the silicon oxide layer 116 through the interface at which the island-shaped oxide semiconductor layer 121 and the silicon oxide layer 116 are in contact with each other. Specifically, a hydrogen atom or a compound including a hydrogen atom such as $H_2O$ included in the island-shaped oxide semiconductor layer 121 can more easily transfer and be diffused into the silicon oxide layer 116. As a result, the impurity concentration in the island-shaped oxide semiconductor layer 121 is reduced.

Next, the substrate 100 is transferred to the third treatment chamber 3230, and the protective insulating layer 103 is formed over the silicon oxide layer 116. The protective insulating layer 103 at least has a function of preventing diffusion of an impurity element and, for example, can be formed using a silicon nitride film, a silicon nitride oxide film, or the like. It is preferable that the impurity concentration in the film formation chamber be reduced by evacuation of the third treatment chamber 3230 using a cryopump or the like.

The protective insulating layer 103 prevents diffusion and entry of an impurity from the outside of the thin film transistor 110. Examples of the impurity are hydrogen, a compound including a hydrogen atom such as $H_2O$, a compound including a carbon atom, and the like.

In the case of forming a silicon nitride film as the protective insulating layer 103 by a sputtering method, film formation is performed by reactive sputtering for example in the following manner: a silicon target is used and a mixed gas of nitrogen and argon is introduced into the third treatment chamber 3230. The film formation is performed at a substrate temperature which is set at a temperature higher than or equal to 100° C. and lower than or equal to 400° C., for example, at a temperature higher than or equal to 200° C. and lower than or equal to 350° C. When film formation is performed in the state where heating is performed, an impurity such as hydrogen, hydroxyl, or a compound including a hydrogen atom such as moisture can be diffused into the silicon oxide layer 116, so that the concentration of the impurity in the island-shaped oxide semiconductor layer 121 can be reduced. In particular, the temperature range of from 200° C. to 350° C. inclusive, at which diffusion of hydrogen atoms is promoted, is preferable.

In the case where the silicon oxide layer 116 and a silicon nitride layer as the protective insulating layer 103 are stacked, the silicon oxide layer and the silicon nitride layer can be formed in the same treatment chamber using a common silicon target. First, a sputtering gas containing oxygen is introduced and the silicon oxide layer is formed using a silicon target placed inside the treatment chamber, and then the sputtering gas is switched to a sputtering gas containing nitrogen and the silicon nitride layer is formed using the same silicon target. Since the silicon oxide layer and the silicon nitride layer can be formed in succession without exposure to the air, an impurity such as hydrogen or moisture can be prevented from being adsorbed on the surface of the silicon oxide layer. In this case, after the silicon oxide layer 116 and the silicon nitride layer as the protective insulating layer 103 are stacked, heat treatment (at a temperature of 100° C. to 400° C.) for diffusing hydrogen or moisture included in the oxide semiconductor layer into the oxide insulating layer (the silicon oxide film including defects) may be performed.

In order to make the impurity such as hydrogen, hydroxyl, or a compound including a hydrogen atom such as moisture to be diffused into the silicon oxide layer 116 and to reduce the concentration of the impurity in the island-shaped oxide semiconductor layer 121, heat treatment may be performed after the film formation of the protective insulating layer 103.

For example, as illustrated in FIG. 4, the substrate 100 is transferred to the fourth treatment chamber 3240 and heat treatment after the film formation is performed. The substrate temperature in the heat treatment after the film formation is set at 100° C. to 400° C. inclusive. With the heat treatment, the impurity included in the oxide semiconductor layer can be diffused more easily into the silicon oxide layer 116 through the interface at which the island-shaped oxide semiconductor layer 121 and the silicon oxide layer 116 are in contact with each other. Specifically, a hydrogen atom or a compound including a hydrogen atom such as $H_2O$ included in the island-shaped oxide semiconductor layer 121 can more easily transfer and be diffused into the oxide insulating film. As a result, the impurity concentration in the oxide semiconductor layer is reduced.

After the heat treatment, the substrate 100 is transferred to the fifth treatment chamber 3250. The substrate is cooled until the temperature is decreased from the substrate temperature T, which is the substrate temperature in the heat treatment after the film formation, to such a sufficiently low temperature as not to cause reentry of an impurity such as water. Specifically, slow cooling is performed to a temperature that is lower than the heating temperature T by 100° C. or more. The cooling may be performed by introducing nitrogen, helium, neon, argon, or the like into the fifth treatment chamber 3250. Note that it is preferable that water, hydrogen, or the like be not included in nitrogen or a rare gas such as helium, neon, or argon which is used for the cooling. In addition, nitrogen or a rare gas such as helium, neon, or argon preferably has a purity of 6N (99.9999%) or higher, more preferably 7N (99.99999%) or higher (that is, the impurity concentration is 1 ppm or lower, preferably 0.1 ppm or lower).

With the film formation apparatus 3000 in which an evacuation unit such as a cryopump is employed, impurities in the treatment chamber can be reduced. Impurities attached to the inner wall of the treatment chamber are eliminated, and incorporation of impurities into a substrate during film formation and a film can be reduced. In addition, impurities discharged from an atmosphere during preheating are eliminated, whereby the impurities can be prevented from being attached to the substrate again.

The silicon oxide layer 116 formed in this manner includes many dangling bonds. When the silicon oxide layer 116 is provided in contact with the island-shaped oxide semiconductor layer 121, the impurity included in the island-shaped oxide semiconductor layer 121, that is, a hydrogen atom or a compound including a hydrogen atom such as $H_2O$, transfers and is diffused from the island-shaped oxide semiconductor layer 121 into the silicon oxide layer 116; accordingly, the concentration of impurity included in the island-shaped oxide semiconductor layer 121 can be reduced.

For example, in a thin film transistor in which an oxide semiconductor layer serving as a channel formation region is in contact with an oxide insulating layer formed with use of a film formation apparatus described in this embodiment, the carrier concentration in the channel formation region is reduced in the state where voltage is not applied to a gate electrode, i.e., in the off state; therefore, the thin film transistor has low off current and has favorable characteristics.

Note that although the structure in which three or more treatment chambers are connected through the transfer chamber is illustrated in FIG. 4, the present invention is not limited thereto. For example, a so-called in-line structure, in which a carry-in entrance and a carry-out exit for a substrate are provided for each treatment chamber and the treatment chambers are connected in series, may be employed.

The above-described process using the film formation apparatus can be used for manufacturing a backplane (a substrate over which a thin film transistor is formed) of a liquid crystal display panel, an electroluminescent display panel, a display device using electronic ink, or the like. Since the above-described process using the film formation apparatus is performed at a temperature lower than or equal to 400° C., the process can be applied to a manufacturing process using a glass substrate having a side more than or equal to 1 meter and a thickness less than or equal to 1 millimeter. Since the whole process can be performed at a treatment temperature lower than or equal to 400° C., a display panel can be manufactured without consuming too much energy.

In the above-described manner, a highly reliable semiconductor device with stable electric characteristics including a thin film transistor in which an oxide semiconductor layer is used can be provided.

Embodiment 2

In this embodiment, another example of a thin film transistor applicable to a semiconductor device disclosed in this embodiment will be described.

One embodiment of a semiconductor device of this embodiment and a manufacturing method thereof are described with reference to FIGS. 5A to 5E.

Figure 5A:
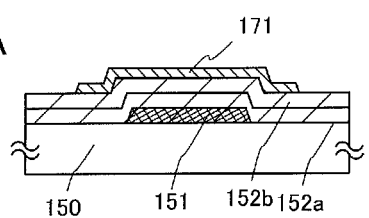
FIGS. 5A to 5E illustrate a method for manufacturing a semiconductor device.
Figure 5B:
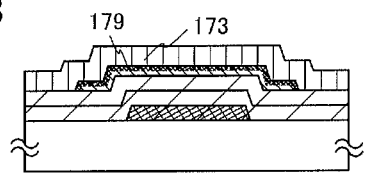
Figure 5C:
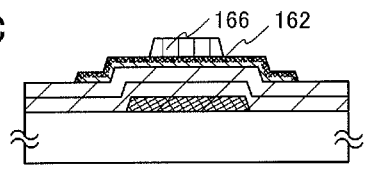
Figure 5D:
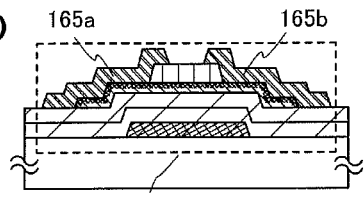
Figure 5E:
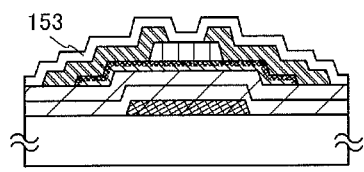

FIGS. 5A to 5E illustrate one example of cross-sectional structures of a semiconductor device. A thin film transistor 160 illustrated in FIG. 5D is one kind of bottom-gate structure called a channel-protective type (channel-stop type) and is also called an inverted staggered thin film transistor.

In order to suppress variation in electric characteristics of a thin film transistor including an oxide semiconductor layer, the thickness of a gate insulating layer is controlled, so that an impurity serving as a variation factor, such as hydrogen, moisture, hydroxyl or hydride, is prevented from entering the oxide semiconductor layer and an interface between the oxide semiconductor layer and an oxide insulating layer (a silicon oxide layer) formed to be in contact with the oxide semiconductor layer.

Thus, in the case where a measurement is performed on the thin film transistor 160 included in a semiconductor device of this embodiment, in which a voltage of 30 V or −30 V is applied to a gate electrode (i.e., the gate voltage Vg is set to 30 V or −30 V) at a temperature of 85° C. for 12 hours, the difference of the threshold voltage of the thin film transistor 160 is 1 V (±1 V) or less, between before and after performance of the measurement. In the thin film transistor 160, the thickness of the gate insulating layer is controlled to be equal to or larger than 100 nm and equal to or smaller than 350 nm, and the hydrogen concentrations in the oxide semiconductor layer and the interface between the oxide semiconductor layer and the oxide insulating layer (the silicon oxide layer) formed in contact therewith are controlled to be $5\times10^{19}/cm^3$ or lower, preferably, $1\times10^{19}/cm^3$ or lower.

As the thin film transistor 160, a single-gate thin film transistor is described; a multi-gate thin film transistor including a plurality of channel formation regions can be formed when needed.

Hereinafter, manufacturing steps of the thin film transistor 160 over a substrate 150 is described with use of FIGS. 5A to 5E.

First, a conductive film is formed over the substrate 150 having an insulating surface, and a first photolithography step is performed thereon, so that a gate electrode layer 151 is formed. Note that a resist mask may be formed by an inkjet method. Formation of the resist mask by an inkjet method needs no photomask; thus, manufacturing cost can be reduced.

The gate electrode layer 151 can be formed to have a single-layer or stacked-layer structure using any of metal materials such as molybdenum, titanium, chromium, tantalum, tungsten, aluminum, copper, neodymium, and scandium, and alloy materials which contains any of these materials as its main component.

Next, a gate insulating layer 152a and a gate insulating layer 152b are formed over the gate electrode layer 151. In order to suppress variation in the electric characteristics of the thin film transistor including the oxide semiconductor layer, the total thickness of the gate insulating layer 152a and the gate insulating layer 152b is controlled to be equal to or larger than 100 nm and equal to or smaller than 350 nm.

In this embodiment, as the gate insulating layer 152a, a silicon nitride layer with a thickness of 100 nm is formed by a sputtering method, and as the gate insulating layer 152b, a silicon oxide layer with a thickness of 100 nm is formed by a sputtering method.

When the total thickness of the gate insulating layers is controlled to be equal to or larger than 100 nm and equal to or smaller than 350 nm, a thin film transistor can have such stable electric characteristics that the difference of the threshold voltage value is 1V (±1V) or less, between before and after performance of a measurement in which a voltage of 30 V or −30 V is applied to the gate electrode (i.e., the gate voltage Vg is 30 V or −30 V) at a temperature of 85° C. for 12 hours.

Next, an oxide semiconductor film is formed over the gate insulating layer 152b, and then, the oxide semiconductor film is processed into an island-shaped oxide semiconductor layer 171 by performance of a second photolithography step. In this embodiment, the oxide semiconductor film is formed by a sputtering method with use of an In—Ga—Zn—O-based metal oxide target.

The substrate is placed in a treatment chamber kept in a reduced pressure state, and is heated to a temperature equal to or higher than room temperature and lower than 400° C. Residual moisture in the treatment chamber is removed, and a sputtering gas in which hydrogen and moisture are removed is introduced. With use of metal oxide as a target, deposition of the oxide semiconductor film is performed over the substrate 150. An adsorption vacuum pump is preferably used for removing residual moisture in the treatment chamber. For example, a cryopump, an ion pump, or a titanium sublimation pump is preferably used. As an evacuation unit, a turbo-molecular pump provided with a cold trap may be used. In the treatment chamber evacuated by using a cryopump, a hydrogen atom, a compound including a hydrogen atom, such as $H_2O$, a compound including a carbon atom, and the like are eliminated; thus, the concentration of an impurity included in the oxide semiconductor film formed in the treatment chamber can be reduced.

As an example of a deposition condition, the distance between the substrate and the target is 100 mm, the pressure is 0.6 Pa, the direct current (DC) power supply is 0.5 kW, and an atmosphere of deposition is an oxygen (the proportion of oxygen flow is 100%) atmosphere. Note that a pulse direct current (DC) power supply is preferable because powder substances (also referred to as particles or dust) generated in the film formation can be reduced and the film thickness can be made uniform. The preferable thickness of the oxide semiconductor film is from 5 nm to 30 nm inclusive. Note that the preferable thickness varies depends on an oxide semiconductor material; thus, the appropriate thickness may be determined depending on a material.

Next, a silicon oxide layer 173 is formed over the gate insulating layer 152b and the oxide semiconductor layer 171.

As the silicon oxide layer 173, a silicon oxide layer including defects is formed in the following manner: the substrate 150 over which layers up to the island-shaped oxide semiconductor layer 171 are formed is heated to a temperature equal to or higher than room temperature and lower than 100° C.; a sputtering gas including high-purity oxygen, from which hydrogen and moisture are removed, is introduced; and a silicon semiconductor target is used. Note that the silicon oxide layer 173 includes defects. The silicon oxide layer 173 is preferably formed to be a silicon oxide ($SiO_x$ where x is preferably equal to or larger than 2) layer.

If the silicon oxide layer 173 including defects is a silicon oxide layer including many oxygen dangling bonds as defects, the binding energy with respect to an impurity such as hydrogen, hydroxyl, or moisture is high; accordingly, more hydrogen or more impurities including hydrogen can be diffused from the oxide semiconductor layer 171 into the silicon oxide layer including defects.

For example, the silicon oxide layer 173 is formed by a pulsed DC sputtering method with use of a boron-doped silicon target which has a purity of 6N (99.9999%) and a resistivity of 0.01 Ω·cm, in which the distance between the substrate and the target (T-S distance) is 89 mm, the pressure is 0.4 Pa, the direct-current (DC) power source is 6 kW, and the atmosphere is an oxygen atmosphere (the proportion of oxygen flow is 100%). The film thickness thereof is 300 nm. Note that instead of a silicon target, quartz (preferably, synthetic quartz) can be used as a target for depositing the silicon oxide film. The deposition of the silicon oxide layer 173 may be performed while the substrate 150 is heated, but it is desirable that the silicon oxide layer 173 be formed at a temperature of approximately 0° C. to 50° C. inclusive, preferably at room temperature so as to include defects.

In this case, deposition of the silicon oxide layer 173 is preferably performed while the residual moisture in the treatment chamber is removed, in order to prevent entry of hydrogen, hydroxyl, or moisture in the oxide semiconductor layer 171 and the silicon oxide layer 173.

Instead of the silicon oxide layer, a silicon oxynitride layer, an aluminum oxide layer, an aluminum oxynitride layer, or the like can be used.

When the silicon oxide layer 173 is formed in contact with the oxide semiconductor layer 171, a mixed region 179 including an oxide semiconductor and silicon oxide is formed at an interface between the oxide semiconductor layer and the silicon oxide layer (see FIG. 5B).

The mixed region 179 includes oxygen, silicon, and at least one kind of metal element that is included in the oxide semiconductor.

The thickness of the mixed region is 1 nm to 10 nm, preferably 2 nm to 5 nm. The thickness of the mixed region can be controlled by the film formation conditions of the sputtering method at the time of forming the silicon oxide layer. If the power supply is set higher and the distance between the substrate and the target is set shorter in the sputtering method, the mixed region can be formed thicker. When the sputtering method is conducted with higher power supply, water adsorbed on a surface of the oxide semiconductor layer or the like can be removed.

Provision of the mixed region 179 between the oxide semiconductor layer 171 and the silicon oxide layer 173 promotes a hydrogen atom, a compound including a hydrogen atom, such as $H_2O$, a compound including a carbon atom, or the like included in the oxide semiconductor layer 171 into the silicon oxide layer 173; accordingly, transfer thereof becomes easier.

Next, heat treatment is performed at 100° C. to 400° C. under the state where the silicon oxide layer 173 including defects is in contact with the oxide semiconductor layer 171. This heat treatment can diffuse hydrogen or moisture included in the oxide semiconductor layer 171 into the silicon oxide layer 173 including defects. Since the silicon oxide layer 173 includes many defects (dangling bonds), an impurity such as hydrogen, hydroxyl, or moisture included in the island-shaped oxide semiconductor layer 171 is diffused into the silicon oxide layer 173 through the interface at which the oxide semiconductor layer 171 and the silicon oxide layer 173 are in contact with each other. Specifically, a hydrogen atom, a compound including a hydrogen atom such as $H_2O$, a compound including a carbon atom, or the like included in the oxide semiconductor layer 171 can more easily transfer and be diffused into the silicon oxide layer 173.

An oxide semiconductor layer 162 in which the concentration of hydrogen and hydroxyl is reduced can be formed. Specifically, the hydrogen concentration at an interface between the oxide semiconductor layer 162 and the silicon oxide layer 173 is $5 \times 10^{19}/cm^3$ or lower, preferably $1 \times 10^{19}/cm^3$ or lower.

By a third photolithography step, a resist mask is formed over the silicon oxide layer 173, and the silicon oxide layer 173 is etched selectively to form a silicon oxide layer 166. Then, the resist mask is removed (see FIG. 5C).

Next, a conductive film is formed over the gate insulating layers 152a and 152b, the oxide semiconductor layer 162, and the silicon oxide layer 166. Then, by a fourth photolithography step, a resist mask is formed and etching is selectively performed, so that a source electrode layer 165a and a drain electrode layer 165b are formed. After that, the resist mask is formed (see FIG. 5D).

As the material of the source electrode layer 165a and the drain electrode layer 165b, there are an element selected from Al, Cr, Cu, Ta, Ti, Mo, and W, an alloy containing any of these elements as its component, an alloy containing a combination of any of these elements, and the like. Further, the metal conductive film may have a single-layer structure or a stacked-layer structure of two or more layers.

Through the above steps, the thin film transistor 160 including the oxide semiconductor layer 162 with reduced concentration of hydrogen and hydride can be formed (see FIG. 5D).

When residual moisture in the reaction atmosphere is removed at the time of the above-described formation of the oxide semiconductor film, the concentration of hydrogen and hydride in the oxide semiconductor film can be reduced. Accordingly, the oxide semiconductor film can be stabilized.

A protective insulating layer may be provided over the oxide insulating layer. In this embodiment, a protective insulating layer 153 is formed over the silicon oxide layer 166, the source electrode layer 165a, and the drain electrode layer 165b. As the protective insulating layer 153, a silicon nitride film, a silicon nitride oxide film, an aluminum nitride film, or the like is used. In this embodiment, the protective insulating layer 153 is formed using a silicon nitride film (see FIG. 5E).

Note that an oxide insulating layer may be further formed over the source electrode layer 165a, the drain electrode layer 165b, and the silicon oxide layer 166. Then, the protective insulating layer 153 may be stacked over the oxide insulating layer. Further, a planarization insulating layer may be formed over the protective insulating layer 153.

When the silicon nitride layer is formed over the silicon oxide layer including defects under the state of heating the substrate, hydrogen or moisture can be diffused from the oxide semiconductor film to the silicon oxide film, and at the same time, the barrier film which prevents entry of moisture from the outside air can be provided.

When residual moisture in the reaction atmosphere is removed at the time of the formation of the oxide semiconductor layer, in which a channel formation region is to be formed, over the gate insulating layer, the concentration of hydrogen and hydride in the oxide semiconductor layer can be reduced. Further, when the silicon oxide layer including defects is provided so as to be in contact with the oxide semiconductor layer, hydrogen or moisture in the oxide semiconductor layer can be diffused into the silicon oxide film and the concentration of hydrogen and a hydrogen compound in the oxide semiconductor layer can be reduced.

This embodiment can be implemented combining with another embodiment as appropriate.

In the above-described manner, a highly reliable semiconductor device with stable electric characteristics including a thin film transistor in which an oxide semiconductor layer is used can be provided.

Embodiment 3

In this embodiment, another example of a thin film transistor applicable to a semiconductor device disclosed in this specification will be described.

One embodiment of a semiconductor device of this embodiment and a manufacturing method thereof is described with reference to FIGS. 6A to 6C.

In order to suppress variation in electric characteristics of a thin film transistor including an oxide semiconductor layer, the thickness of a gate insulating layer is controlled, so that an impurity serving as a variation factor, such as hydrogen, moisture, hydroxyl or hydride, is prevented from entering the oxide semiconductor layer and an interface between the oxide semiconductor layer and an oxide insulating layer (a silicon oxide layer) formed to be in contact with the oxide semiconductor layer.

Thus, in the case where a measurement is performed on a thin film transistor 190 included in a semiconductor device of this embodiment, in which a voltage of 30 V or −30 V is applied to a gate electrode (i.e., the gate voltage Vg is set to 30 V or −30 V) at a temperature of 85° C. for 12 hours, the difference of the threshold voltage value of the thin film transistor 190 is 1 V (±1 V) or less, between before and after performance of the measurement. In the thin film transistor 190, the thickness of a gate insulating layer is controlled to be equal to or larger than 100 nm and equal to or smaller than 350 nm, and the hydrogen concentrations in the oxide semiconductor layer and the interface between the oxide semiconductor layer and the oxide insulating layer (the silicon oxide layer) formed in contact therewith are controlled to be $5\times10^{19}/cm^3$ or lower, preferably, $1\times10^{19}/cm^3$ or lower.

As the thin film transistor 190, a single-gate thin film transistor is described; a multi-gate thin film transistor including a plurality of channel formation regions can be formed when needed.

Hereinafter, manufacturing steps of the thin film transistor 190 over a substrate 140 are described with use of FIGS. 6A to 6C.

First, a conductive film is formed over the substrate 140 having an insulating surface, and a first photolithography step is performed thereon, so that a gate electrode layer 181 is formed. In this embodiment, the gate electrode layer 181 is formed using a tungsten film with a thickness of 150 nm by a sputtering method.

Next, a gate insulating layer 142 is formed over the gate electrode layer 181. In order to suppress variation in electric characteristics of the thin film transistor including an oxide semiconductor layer, the thickness of the gate insulating layer 142 is controlled to be equal to or larger than 100 nm and equal to or smaller than 350 nm. In this embodiment, a silicon oxynitride layer having a thickness of 100 nm or smaller is formed by a plasma CVD method as the gate insulating layer 142.

When the thickness of the gate insulating layer is controlled to be equal to or larger than 100 nm and equal to or smaller than 350 nm, a thin film transistor can have such stable electric characteristics that the difference of the threshold voltage value is 1V (±1V) or less, between before and after performance of a measurement in which a voltage of 30 V or −30 V is applied to the gate electrode (i.e., the gate voltage Vg is 30 V or −30 V) at a temperature of 85° C. for 12 hours.

Next, a conductive film is formed over the gate insulating layer 142. After that, a resist mask is formed by a second photolithography step, the conductive film is selectively etched to form a source electrode layer 195a and a drain electrode layer 195b, and then, the resist mask is removed.

Figure 6A:
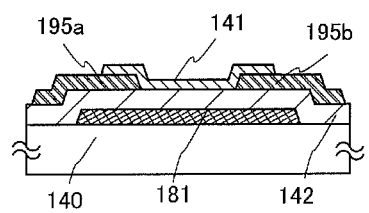
FIGS. 6A to 6C illustrate a method for manufacturing a semiconductor device.
Figure 6B:
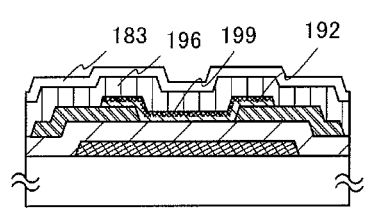
Figure 6C:
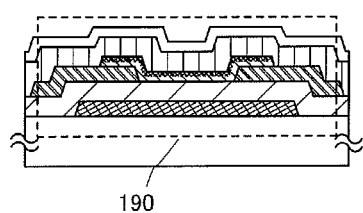

Next, an oxide semiconductor film is formed and processed into an island-shaped oxide semiconductor layer 141 by a third photolithography step (see FIG. 6A). In this embodiment, the oxide semiconductor film is formed by a sputtering method with use of an In—Ga—Zn—O-based metal oxide target.

The substrate is placed in a treatment chamber kept in a reduced pressure state, and is heated to a temperature equal to or higher than room temperature and lower than 400° C. Residual moisture in the treatment chamber is removed, and a sputtering gas in which hydrogen and moisture are removed is introduced. With use of metal oxide as a target, deposition of the oxide semiconductor film is performed over the substrate 140. An adsorption vacuum pump is preferably used for removing residual moisture in the treatment chamber. For example, a cryopump, an ion pump, or a titanium sublimation pump is preferably used. As an evacuation unit, a turbo-molecular pump provided with a cold trap may be used. In the treatment chamber evacuated by using a cryopump, a hydrogen atom, a compound including a hydrogen atom, such as $H_2O$, a compound including a carbon atom, and the like are eliminated; thus, the concentration of an impurity included in the oxide semiconductor film formed in the treatment chamber can be reduced.

As an example of a deposition condition, the distance between the substrate and the target is 100 mm, the pressure is 0.6 Pa, the direct current (DC) power supply is 0.5 kW, and an atmosphere of deposition is an oxygen (the proportion of oxygen flow is 100%) atmosphere. Note that a pulse direct current (DC) power supply is preferable because powder substances (also referred to as particles or dust) generated in the film formation can be reduced and the film thickness can be made uniform. The preferable thickness of the oxide semiconductor film is from 5 nm to 30 nm inclusive. Note that the preferable thickness varies depends on an oxide semiconductor material; thus, the appropriate thickness may be determined depending on a material.

Next, a silicon oxide layer 196 is formed over the gate insulating layer 142, the oxide semiconductor layer 141, the source electrode layer 195a, and the drain electrode layer 195b.

As the silicon oxide layer 196, a silicon oxide layer including defects is formed in the following manner: the substrate 140 over which layers up to the island-shaped oxide semiconductor layer 141 are formed is heated to a temperature equal to or higher than room temperature and lower than 100° C.; a sputtering gas including high-purity oxygen, from which hydrogen and moisture are removed, is introduced; and a silicon semiconductor target is used. The silicon oxide layer 196 is preferably formed to be a silicon oxide ($SiO_x$ where x is preferably equal to or larger than 2) layer.

If the silicon oxide layer 196 including defects is a silicon oxide layer including many oxygen dangling bonds as defects, the binding energy with respect to an impurity such as hydrogen, hydroxyl, or moisture is high; accordingly, more hydrogen or more impurities including hydrogen can be diffused from the oxide semiconductor layer 141 into the silicon oxide layer including defects.

For example, the silicon oxide layer 196 is formed by a pulsed DC sputtering method with use of a boron-doped silicon target which has a purity of 6N (99.9999%) and a resistivity of 0.01 Ω·cm, in which the distance between the substrate and the target (T-S distance) is 89 mm, the pressure is 0.4 Pa, the direct-current (DC) power source is 6 kW, and the atmosphere is an oxygen atmosphere (the proportion of oxygen flow is 100%). The film thickness thereof is 300 nm. Note that instead of a silicon target, quartz (preferably, synthetic quartz) can be used as a target for depositing the silicon oxide layer 196. The deposition of the silicon oxide layer 196 may be performed while the substrate 140 is heated, but it is desirable that the silicon oxide layer 196 be formed at a temperature of approximately 0° C. to 50° C. inclusive, preferably at room temperature so as to include defects.

In this case, deposition of the silicon oxide layer 196 is preferably performed while the residual moisture in the treatment chamber is removed in order to prevent entry of hydrogen, hydroxyl, or moisture in the oxide semiconductor layer 141 and the silicon oxide layer 196.

Instead of the silicon oxide layer, a silicon oxynitride layer, an aluminum oxide layer, an aluminum oxynitride layer, or the like can be used.

When the silicon oxide layer 196 is formed in contact with the oxide semiconductor layer 141, a mixed region 199 including an oxide semiconductor and silicon oxide is formed at an interface between the oxide semiconductor layer and the silicon oxide layer.

The mixed region 199 includes oxygen, silicon, and at least one metal element contained in the oxide semiconductor.

The thickness of the mixed region is 1 nm to 10 nm, preferably 2 nm to 5 nm. The thickness of the mixed region can be controlled by the film formation conditions of the sputtering method at the time of forming the silicon oxide layer. If the power supply is set higher and the distance between the substrate and the target is set shorter in the sputtering method, the mixed region can be formed thicker. When the sputtering method is conducted with higher power supply, water adsorbed on a surface of the oxide semiconductor layer or the like can be removed.

Provision of the mixed region 199 between the oxide semiconductor layer 141 and the silicon oxide layer 196 promotes a hydrogen atom, a compound including a hydrogen atom such as $H_2O$, a compound including a carbon atom, or the like included in the oxide semiconductor layer 141 to be diffused into the silicon oxide layer 196; accordingly, transfer thereof becomes easier.

Next, a protective insulating layer 183 is formed over the silicon oxide layer 196. As the protective insulating layer 183, a silicon nitride film, a silicon nitride oxide film, an aluminum nitride film, or the like can be used. As the protective insulating layer 183, a silicon nitride film is formed by heating the substrate 140 over which layers up to the silicon oxide layer 196 are formed, to a temperature of 100° C. to 400° C., introducing a sputtering gas containing high-purity nitrogen from which hydrogen and moisture are removed, and using a target of silicon semiconductor.

While the protective insulating layer 183 is formed, the substrate 140 is heated to a temperature of 100° C. to 400° C., whereby hydrogen or moisture included in the oxide semiconductor layer can be diffused into the oxide insulating layer (the silicon oxide film including defects). Since the silicon oxide layer 196 includes many defects (dangling bonds), an impurity such as hydrogen, hydroxyl, or moisture included in the island-shaped oxide semiconductor layer 141 is diffused into the silicon oxide layer 196 through the interface at which the oxide semiconductor layer 141 and the silicon oxide layer 196 are in contact with each other. Specifically, a hydrogen atom, a compound including a hydrogen atom such as $H_2O$, a compound including a carbon atom, or the like included in the oxide semiconductor layer 141 can more easily transfer to be diffused into the silicon oxide layer 196.

Through the above steps, the thin film transistor 190 including an oxide semiconductor layer 192 with reduced concentration of hydrogen and hydroxyl can be formed. Specifically, the hydrogen concentration at an interface between the oxide semiconductor layer 141 and the silicon oxide layer 196 is $5\times10^{19}/cm^3$ or lower, preferably $1\times10^{19}/cm^3$ or lower.

This embodiment can be implemented combining with another embodiment as appropriate.

In the above-described manner, a highly reliable semiconductor device with stable electric characteristics including a thin film transistor in which an oxide semiconductor layer is used can be provided.

Embodiment 4

In this embodiment, an example of a thin film transistor applicable to a semiconductor device disclosed in this specification will be described.

An example in this embodiment shows that a gate electrode layer and source and drain electrode layers are formed using a light-transmitting conductive material. Except those, the thin film transistor can be formed in a manner similar to that in the above embodiment; accordingly, repetitive description of the same components or components having functions similar to those of above embodiment and repetitive description of similar process will be omitted. Further, detailed description of the same parts will also be omitted.

For example, as materials of the gate electrode layer and the source and drain electrode layers, a conductive material that transmits visible light can be used. For example, any of the following metal oxides can be used: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof is set in the range of from 50 nm to 300 nm inclusive. As a deposition method of the metal oxide used for the gate electrode layer and the source and drain electrode layers, a sputtering method, a vacuum evaporation method (an electron beam evaporation method or the like), an arc discharge ion plating method or a spray method is used. When a sputtering method is employed, it is preferable that deposition be performed using a target containing $SiO_2$ of 2 wt % to 10 wt % inclusive and $SiO_x$ (x>0) which inhibits crystallization be contained in the light-transmitting conductive film so as to prevent crystallization of the oxide semiconductor layer at the time of the heat treatment in a later step.

Note that the unit of the percentage of components in the light-transmitting conductive film is atomic percent, and the percentage of components is evaluated by analysis using an electron probe X-ray microanalyzer (EPMA).

In the pixel provided with the thin film transistor, a pixel electrode layer, another electrode layer such as a capacitor electrode layer, or a wiring layer such as a capacitor wiring layer is formed using a conductive film transmitting visible light, so that a display device having high aperture ratio is realized. Needless to say, it is preferable that a gate insulating layer, an oxide insulating layer, a protective insulating layer, and a planarization insulating layer be each formed using a film transmitting visible light.

In this specification, a film transmitting visible light indicates a film having such a thickness as to have transmittance of visible light of 75% to 100%. In the case where the film has conductivity, the film is referred to as a transparent conductive film. Further, a conductive film which is semi-transmissive with respect to visible light may be used for metal oxide applied to the gate electrode layer, the source electrode layer, the drain electrode layer, the pixel electrode layer, another electrode layer, or another wiring layer. The conductive film which is semi-transmissive with respect to visible light indicates a film having transmittance of visible light of 50% to 75%.

In a thin film transistor having a light-transmitting property, an aperture ratio can be improved. For small liquid crystal display panels of 10 inches or smaller in particular, a high aperture ratio can be achieved even when the size of pixels is decreased in order to realize higher resolution of display images by increasing the number of gate wirings, for example. Further, by using a film having a light-transmitting property for components of a thin film transistor, a high aperture ratio can be achieved even when one pixel is divided into a plurality of sub-pixels in order to realize a wide viewing angle. That is, a high aperture ratio can be maintained even when a group of high-density thin film transistors is provided, and the display region can have a sufficient area. For example, in the case where one pixel includes two to four sub-pixels, the aperture ratio can be improved because the thin film transistor has a light-transmitting property. Further, a storage capacitor may be formed using the same material by the same step as the component in the thin film transistor so that the storage capacitor can have a light-transmitting property, whereby the aperture ratio can be further improved.

This embodiment can be implemented combining with another embodiment as appropriate.

Embodiment 5

In this embodiment, an example of a thin film transistor applicable to a semiconductor device disclosed in this specification will be described.

In this embodiment, an example will be described, in which oxide conductive layers are provided as a source region and a drain region between the oxide semiconductor layer and the source and drain electrode layers in the structure described in Embodiment 1, with reference to FIG. 7. Except formation of the oxide conductive layers, the thin film transistor can be formed in a similar manner to Embodiment 1; thus, repetitive description of the same components or components having similar functions as in Embodiment 1 and repetitive description of similar process will be omitted. Further, since a structure illustrated in FIG. 7 is the same as that in FIGS. 1A to 1E except for part of steps, the same portions are denoted by the same reference numerals and the detailed description of the same portions will be omitted.

Figure 7:
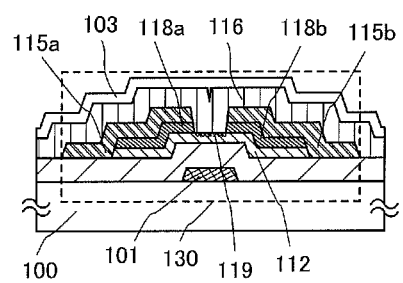
FIG. 7 illustrates a semiconductor device.

A thin film transistor 130 illustrate in FIG. 7 is of channel-etch type, which includes, over the substrate 100 having an insulating surface, the gate electrode layer 101, the gate insulating layer 102, the oxide semiconductor layer 112, oxide conductive layers 118a and 118b, the source electrode layer 115a, and the drain electrode layer 115b. In addition, the silicon oxide layer 116 which covers the thin film transistor 130 and is in contact with the oxide semiconductor layer 112 is provided, and the protective insulating layer 103 is stacked thereover. The silicon oxide layer 116 has many defects, and a mixed region 119 is provided between the oxide semiconductor layer 112 and the silicon oxide layer 116.

In accordance with Embodiment 1, the gate electrode layer 101 is formed over the substrate 100, and the gate insulating layer 102 is stacked thereover. An oxide semiconductor film is formed over the gate insulating layer 102 and processed into an oxide semiconductor layer.

The oxide conductive layers 118a and 118b are formed over the oxide semiconductor layer. Described in this embodiment is an example in which the oxide conductive layers 118a and 118b are processed into appropriate shapes by a photolithography step performed for formation of the oxide semiconductor layer; however, the oxide conductive layers 118a and 118b may be processed into the appropriate shapes by a photolithography step performed for formation of the source electrode layer and the drain electrode layer.

As the formation method of the oxide conductive layers 118a and 118b, a sputtering method, a vacuum evaporation method (an electron beam evaporation method or the like), an arc discharge ion plating method, or a spray method can be used. It is preferable that a material of each of the oxide conductive layers 118a and 118b not contain indium oxide but contain zinc oxide as its component. For such oxide conductive layers 118a and 118b, zinc oxide, zinc aluminum oxide, zinc aluminum oxynitride, gallium zinc oxide, or the like can be used. The thickness of the oxide conductive film is set within the range from 50 nm to 300 nm inclusive, as appropriate. When a sputtering method is employed, it is preferable that deposition be performed using a target containing $SiO_2$ of 2 wt % to 10 wt % inclusive and $SiO_x$ (x>0) which inhibits crystallization be contained in the oxide conductive film so as to prevent crystallization of the oxide semiconductor layer at the time of the heat treatment in a later step.

In this embodiment, the oxide conductive layers 118a and 118b are formed as follows: processing into an appropriate shape is performed by a photolithography step which is also performed for formation of the oxide semiconductor layer; and etching is performed using the source electrode layer 115a and the drain electrode layer 115b as masks. The oxide conductive layers 118a and 118b can be easily etched with an alkaline solution functioning as a resist stripper when they contain a zinc oxide as a component.

Etching treatment for dividing the oxide conductive layer in order to form a channel formation region is performed by utilizing the difference in etching rates between the oxide semiconductor layer and the oxide conductive layer. The oxide conductive layer over the oxide semiconductor layers is selectively etched utilizing a higher etching rate of the oxide conductive layer as compared with that of the oxide semiconductor layer.

Therefore, it is preferable that a resist mask used for formation of the source electrode layer 115a and the drain electrode layer 115b be removed by an ashing step. In the case of etching with a stripping solution, etching conditions (such as the kind of the etchant, the concentration, and the etching time) are adjusted as appropriate so that the oxide conductive layers and the oxide semiconductor layer are not etched off too much.

The oxide conductive layer 118b which is disposed between the oxide semiconductor layer 112 and the drain electrode layer 115b formed using a metal material also function as a low-resistance drain (LRD, also referred to as an LRN (low-resistance n-type conductivity)) region. Similarly, the oxide conductive layer 118a which is disposed between the oxide semiconductor layer 112 and the source electrode layer 115a formed using a metal material also functions as a low-resistance source (LRS, also referred to as an LRN (low-resistance n-type conductivity)) region. With the structure of the oxide semiconductor layer, the low-resistance drain region, and the drain electrode layer formed using a metal material, withstand voltage of the transistor can be further increased. In particular, the carrier concentration of the low-resistance drain region is preferably in the range of $1 \times 10^{20}/cm^3$ to $1 \times 10^{21}/cm^3$ inclusive, for example.

When the oxide conductive layers are provided as the source region and the drain region between the oxide semiconductor layer and the source and drain electrode layers, the source region and the drain region can have lower resistance and the transistor can operate at high speed. It is effective to use the oxide conductive layers for a source region and a drain region in order to improve frequency characteristics of a peripheral circuit (a driver circuit). This is because the contact between a metal electrode (e.g., Ti) and an oxide conductive layer can reduce the contact resistance as compared with the contact between a metal electrode (e.g., Ti) and an oxide semiconductor layer.

Further, there has been a problem in that molybdenum (Mo) which is used as a part of a wiring material (e.g., Mo/Al/Mo) in a semiconductor device has high contact resistance with an oxide semiconductor layer. This is because molybdenum is not readily oxidized as compared with titanium and thus extracts a small amount of oxygen from the oxide semiconductor layer, which does not allow the interface between the molybdenum and the oxide semiconductor layer to be n-type. However, even in such a case, the contact resistance can be reduced by interposing an oxide conductive layer between the oxide semiconductor layer and source and drain electrode layers; accordingly, frequency characteristics of a peripheral circuit (a driver circuit) can be improved.

The channel length of the thin film transistor is determined at the time of etching the oxide conductive layer; accordingly, the channel length can be further shortened. For example, the channel length (L) can be set as small as 0.1 µm to 2 µm inclusive; in this way, operation speed can be increased.

Although this embodiment is described with use of Embodiment as an example, this embodiment can be implemented combining with any another embodiment as appropriate.

In the above-described manner, a highly reliable semiconductor device with stable electric characteristics can be provided as a semiconductor device including a thin film transistor using an oxide semiconductor layer.

Embodiment 6

In this embodiment, an example of manufacturing an active matrix light-emitting display device using a thin film transistor and a light-emitting element using electroluminescence, in the semiconductor device according to any of Embodiments 1 to 5 will be described.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 8:
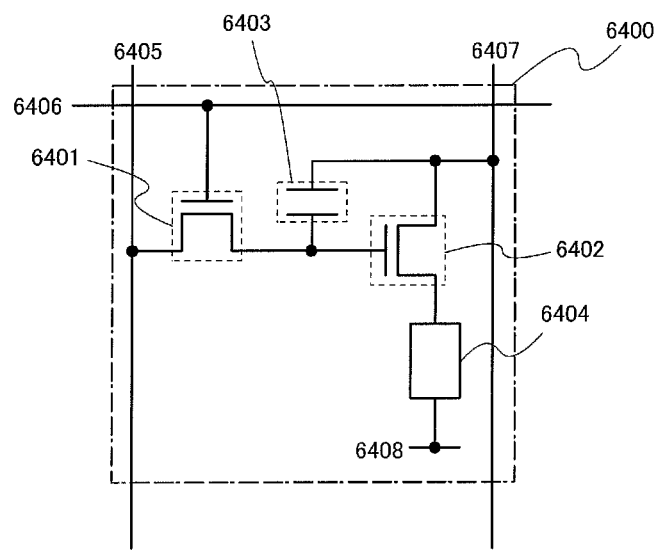
FIG. 8 illustrates an equivalent circuit of a pixel in a semiconductor device.

FIG. 8 illustrates an example of a pixel structure which can be driven by a digital time grayscale method, as an example of a semiconductor device to.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to the sum of voltage of the power supply line and Vth of the driver transistor 6402 is applied to the signal line 6405.

In the case of performing analog grayscale driving instead of digital time grayscale driving, the same pixel structure as that in FIG. 8 can be used by changing signal input.

In the case of performing analog grayscale driving, a voltage higher than or equal to the sum of forward voltage of the light-emitting element 6404 and Vth of the driver transistor 6402 is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure illustrated in FIG. 8 is not limited thereto. For example, a switch, a resistor, a capacitor, a transistor, a logic circuit, or the like may be added to the pixel illustrated in FIG. 8.

Figure 9A:
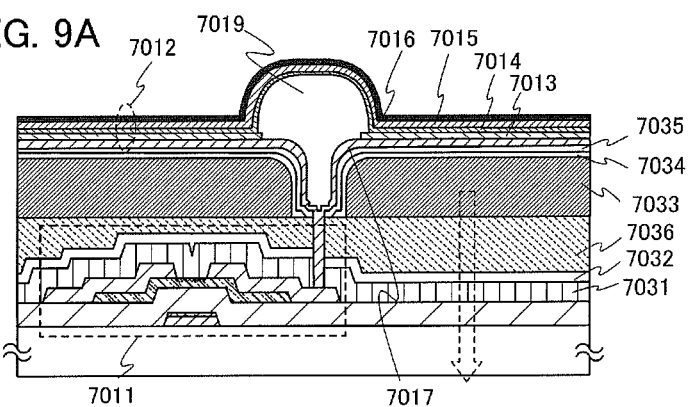
FIGS. 9A to 9C each illustrate a semiconductor device.
Figure 9B:
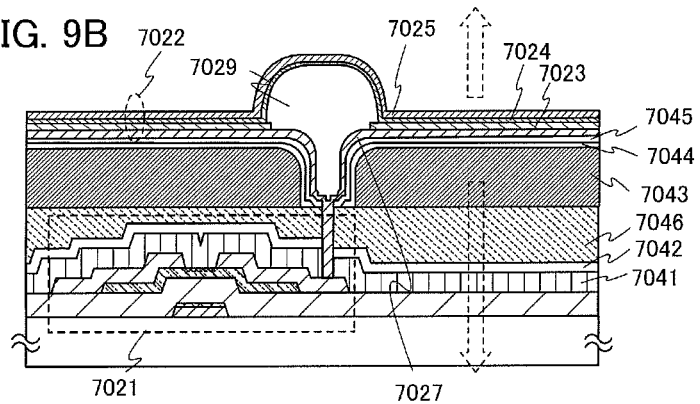
Figure 9C:
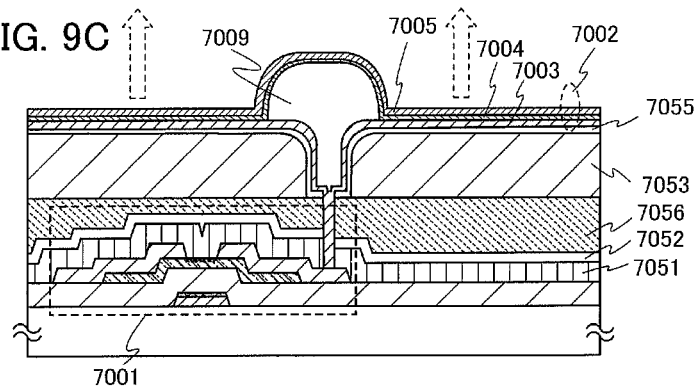

Next, structures of light-emitting elements are described using FIGS. 9A to 9C. Here, a cross-sectional structure of a pixel will be described by taking an n-channel driving TFT as an example. Driving TFTs 7001, 7011, and 7021 which are used for semiconductor devices of FIGS. 9A to 9C, respectively can be manufactured in a manner similar to the thin film transistor described in any of Embodiments 1 to 5. In this embodiment, the thin film transistor described in Embodiment 4 is used, and a light-transmitting thin film transistor including an oxide semiconductor layer, which can be manufactured in a manner similar to that of Embodiment 4, is described as an example.

The driving TFTs 7001, 7011, and 7021 each includes a mixed region between an oxide semiconductor layer and a silicon oxide layer. The silicon oxide ($SiO_x$ where x is preferably equal to or larger than 2) layer including many defects (a large amount of oxygen dangling bonds is preferable) is stacked and heat treatment is performed, whereby hydrogen or water included in the oxide semiconductor layer is diffused to the silicon oxide layer; accordingly, hydrogen or water in the oxide semiconductor layer is reduced. In each of the driving TFTs 7001, 7011, and 7021, the difference of the threshold voltage value is 1V (±1V) or less, between before and after performance of a measurement in which a voltage of 30 V or −30 V is applied to the gate electrode (i.e., the gate voltage Vg is 30 V or −30 V) at a temperature of 85° C. for 12 hours. In each of the driving TFTs 7001, 7011, and 7021, the thickness of the gate insulating layer is controlled to be equal to or larger than 100 nm and equal to or smaller than 350 nm, and the hydrogen concentration at an interface between the oxide semiconductor layer and the oxide insulating layer (a silicon oxide layer) in contact with the oxide semiconductor layer is controlled to be $5\times10^{19}/cm^3$ or lower, preferably, $1\times10^{19}/cm^3$ or lower. Therefore, the driving TFTs 7001, 7011, and 7021 have high reliability.

In order to extract light emitted from the light-emitting element, at least one of an anode and a cathode is required to transmit light. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

Next, a light-emitting element having a bottom emission structure will be described with reference to FIG. 9A.

FIG. 9A is a cross-sectional view of a pixel in the case where the driving TFT 7011 is an n-channel transistor and light is emitted from a light-emitting element 7012 to a first electrode 7013 side. In FIG. 9A, the first electrode 7013 of the light-emitting element 7012 is formed over a light-transmitting conductive film 7017 which is electrically connected to a drain electrode layer of the driving TFT 7011, and an EL layer 7014 and a second electrode 7015 are stacked in this order over the first electrode 7013.

As the light-transmitting conductive film 7017, a light-transmitting conductive film such as a film of indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added can be used.

Any of a variety of materials can be used for the first electrode 7013 of the light-emitting element. For example, in the case of using the first electrode 7013 as a cathode, the first electrode 7013 is preferably formed using a material having a low work function examples of which are an alkali metal such as Li or Cs; an alkaline earth metal such as Mg, Ca, or Sr; an alloy containing any of these metals (e.g., Mg:Ag or Al:Li); and a rare earth metal such as Yb or Er. In FIG. 9A, the first electrode 7013 is formed to have a thickness enough to transmit light (preferably, approximately 5 nm to 30 nm). For example, an aluminum film with a thickness of 20 nm can be used as the first electrode 7013.

Alternatively, a light-transmitting conductive film and an aluminum film may be stacked and then selectively etched so as to form the light-transmitting conductive film 7017 and the first electrode 7013. In this case, the etching can be performed using the same mask, which is preferable.

Further, the peripheral portion of the first electrode 7013 is covered with a partition 7019. The partition 7019 is formed using an organic resin film of polyimide, acrylic, polyimide, epoxy, or the like, an inorganic insulating film, or organic polysiloxane. It is particularly preferable that the partition 7019 be formed using a photosensitive resin material to have an opening portion over the first electrode 7013 so that a sidewall of the opening portion is formed as a tilted surface with continuous curvature. In the case where a photosensitive resin material is used for the partition 7019, a step of forming a resist mask can be omitted.

The EL layer 7014 which is formed over the first electrode 7013 and the partition 7019 includes at least the light-emitting layer and may be formed using a single layer or a plurality of layers stacked. When the EL layer 7014 is formed using a plurality of layers, the EL layer 7014 is formed by stacking an electron-injection layer, an electron-transport layer, a light-emitting layer, a hole-transport layer, and a hole-injection layer in this order over the first electrode 7013 which functions as a cathode. It is not necessary to form all of these layers.

In addition, the present invention is not limited to the above order of the stacked layers; that is, the first electrode 7013 may function as an anode and the EL layer 7014 may be formed by stacking a hole-injection layer, a hole-transport layer, a light-emitting layer, an electron-transport layer, and an electron-injection layer in this order over the first electrode 7013. Note that when power consumption is contrasted, it is more preferable that an electron-injection layer, an electron-transport layer, a light-emitting layer, a hole-transport layer, and a hole-injection layer are stacked in this order over the first electrode 7013 which functions as a cathode because an increase in voltage in the driver circuit portion can be suppressed and power consumption can be reduced.

Any of a variety of materials can be used for the second electrode 7015 which is formed over the EL layer 7014. For example, in the case of using the second electrode 7015 as an anode, a material having a high work function, examples of which are ZrN, Ti, W, Ni, Pt, Cr, and a transparent conductive material such as ITO, IZO, and ZnO, is preferable. Further, a light-blocking film 7016, e.g., a metal which blocks light, a metal which reflects light, or the like is formed over the second electrode 7015. In this embodiment, an ITO film is used as the second electrode 7015 and a Ti film is used as the light-blocking film 7016.

The light-emitting element 7012 corresponds to a region where the EL layer 7014 including the light-emitting layer is sandwiched between the first electrode 7013 and the second electrode 7015. In the case of the element structure illustrated in FIG. 9A, light is emitted from the light-emitting element 7012 to the first electrode 7013 side as indicated by an arrow.

In the example shown in FIG. 9A, a light-transmitting conductive film is used as a gate electrode layer and a light-transmitting this film is used for the source and drain electrode layers, and light emitted from the light-emitting element 7012 passes through a color filter layer 7033 to be ejected through the substrate.

The color filter layer 7033 is formed by a droplet discharge method such as an inkjet method, a printing method, an etching method with the use of a photolithography technique, or the like.

The color filter layer 7033 is covered with the overcoat layer 7034, and also covered with the protective insulating layer 7035. Note that although the overcoat layer 7034 is illustrated to have a small thickness in FIG. 9A, the overcoat layer 7034 has a function of reducing unevenness caused by the color filter layer 7033.

A contact hole which is formed in a planarization insulating layer 7036, the protective insulating layer 7035, an insulating layer 7032, and an insulating layer 7031 and reaches the drain electrode layer is provided in a portion which overlaps with the partition 7019.

Next, a light-emitting element with a dual-emission structure will be described with reference to FIG. 9B.

In FIG. 9B, a first electrode 7023 of a light-emitting element 7022 is formed over a light-transmitting conductive film 7027 which is electrically connected to a drain electrode layer of the driving TFT 7021, and an EL layer 7024 and a second electrode 7025 are stacked in this order over the first electrode 7023.

As the light-transmitting conductive film 7027, a light-transmitting conductive film such as a film of indium oxide including tungsten oxide, indium zinc oxide including tungsten oxide, indium oxide including titanium oxide, indium tin oxide including titanium oxide, indium tin oxide, indium zinc oxide, or indium tin oxide to which silicon oxide is added can be used.

Any of a variety of materials can be used for the first electrode 7023. For example, in the case of using the first electrode 7023 as a cathode, the first electrode 7023 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 is used as a cathode and is formed to have a thickness through which light can be transmitted (preferably, approximately 5 nm to 30 nm). For example, an aluminum film with a thickness of 20 nm can be used as the cathode.

Alternatively, a light-transmitting conductive film and an aluminum film may be stacked and then selectively etched so as to form the light-transmitting conductive film 7027 and the first electrode 7023. In this case, the etching can be performed using the same mask, which is preferable.

Further, the peripheral portion of the first electrode 7023 is covered with a partition 7029. The partition 7029 is formed using an organic resin film of polyimide, acrylic, polyamide, epoxy, or the like, an inorganic insulating film, or organic polysiloxane. It is particularly preferable that the partition 7029 be formed using a photosensitive resin material to have an opening portion over the first electrode 7023 so that a sidewall of the opening portion is formed as a tilted surface with continuous curvature. In the case where a photosensitive resin material is used for the partition 7029, a step of forming a resist mask can be omitted.

The EL layer 7024 which is formed over the first electrode 7023 and the partition 7029 includes at least the light-emitting layer and may be formed using a single layer or a plurality of layers stacked. When the EL layer 7024 is formed using a plurality of layers, the EL layer 7024 is formed by stacking an electron-injection layer, an electron-transport layer, a light-emitting layer, a hole-transport layer, and a hole-injection layer in that order over the first electrode 7023 which functions as a cathode. It is not necessary to form all of these layers.

The stacking order is not limited to the above. The first electrode 7023 may be used as an anode, and a hole-injection layer, a hole-transport layer, a light-emitting layer, an electron-transport layer, and an electron-injection layer may be stacked in this order over the anode. Note that when power consumption is contrasted, it is more preferable that an electron-injection layer, an electron-transport layer, a light-emitting layer, a hole-transport layer, and a hole-injection layer are stacked in that order over the first electrode 7023 which functions as a cathode because power consumption can be suppressed.

Any of a variety of materials can be used for the second electrode 7025 which is formed over the EL layer 7024. For example, in the case of using the second electrode 7025 as an anode, a material having a high work function, examples of which include a transparent conductive material such as ITO, IZO, and ZnO, is preferably used. In this embodiment, the second electrode 7025 is used as an anode and an ITO film containing a silicon oxide is formed as the second electrode 7025.

The light-emitting element 7022 corresponds to a region where the EL layer 7024 including the light-emitting layer is sandwiched between the first electrode 7023 and the second electrode 7025. In the case of the element structure illustrated in FIG. 9B, light emitted from the light-emitting element 7022 is emitted from both the second electrode 7025 side and the first electrode 7023 side as indicated by arrows.

In the example shown in FIG. 9B, a light-transmitting conductive film is used as a gate electrode layer and light-transmitting thin films are used as the source electrode layer and the drain electrode layer, and light emitted from the light-emitting element 7022 to the first electrode 7023 side can pass through a color filter layer 7043 to be ejected though a substrate.

The color filter layer 7043 is formed by a droplet discharge method such as an inkjet method, a printing method, an etching method with the use of a photolithography technique, or the like.

The color filter layer 7043 is covered with the overcoat layer 7044, and also covered with the protective insulating layer 7045.

A contact hole which is formed in a planarization insulating layer 7046, a protective insulating layer 7045, an insulating layer 7042, and an insulating layer 7041 and which reaches the drain electrode layer is provided so as to overlap the partition 7029.

Note that in the case where full-color display is realized on both display surfaces by using a light-emitting element having a dual emission structure, light emitted from the second electrode 7025 side does not pass through the color filter layer 7043; therefore, it is preferable that a sealing substrate having a color filter layer be further provided over the second electrode 7025.

Next, a light-emitting element having a top emission structure is described with reference to FIG. 9C.

FIG. 9C is a cross-sectional view of a pixel in the case where the driving TFT 7001 is an n-channel transistor and light is emitted from a light-emitting element 7002 to a second electrode 7005 side. In FIG. 9C, a drain electrode of the driving TFT 7001 is in contact with a first electrode 7003; that is, the driving TFT 7001 is electrically connected to the first electrode 7003 of the light-emitting element 7002. An EL layer 7004 and a second electrode 7005 are stacked over the first electrode 7003 in this order.

Any of a variety of materials can be used for the first electrode 7013 of the light-emitting element. For example, in the case of using the first electrode 700 as a cathode, a material having a high work function, such as an alkali metal such as Li or Cs, an alkaline-earth metal such as Mg, Ca, or Sr, an alloy containing any of these (Mg:Ag, Al:Li, or the like), or a rare-earth metal such as Yb or Er.

Further, the peripheral portion of the first electrode 7003 is covered with a partition 7009. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have an opening over the first electrode 7003 so that a sidewall of the opening is formed to have a tilted surface with continuous curvature. In the case where a photosensitive resin material is used for the partition 7009, a step of forming a resist mask can be omitted.

The EL layer 7004 which is formed over the first electrode 7003 and the partition 7009 includes at least the light-emitting layer and may be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in this order over the first electrode 7003 which functions as a cathode. It is not necessary to form all of these layers.

In addition, the present invention is not limited to the above order of the stacked layers; that is, the EL layer 7004 may be formed by stacking a hole-injection layer, a hole-transport layer, a light-emitting layer, an electron-transport layer, and an electron-injection layer in this order over the first electrode 7003 which is used as an anode.

In FIG. 9C, a hole-injection layer, a hole-transport layer, a light-emitting layer, an electron-transport layer, and an electron-injection layer are stacked in this order over a stacked film in which a Ti film, an aluminum film, and a Ti film are stacked in this order, and thereover, a stacked layer of a Mg:Ag alloy thin film and ITO is formed.

However, in the case where the driving TFT 7001 is an n-channel TFT, it is preferable that an electron-injection layer, an electron-transport layer, a light-emitting layer, a hole-transport layer, and a hole-injection layer are stacked in this order over the first electrode 7003 because a voltage increase in a driver circuit can be suppressed and power consumption can be reduced.

The second electrode 7005 is formed using a light-transmitting conductive material; for example, a light-transmitting conductive film of indium oxide containing tungsten oxide, indium zinc oxide containing tungsten oxide, indium oxide containing titanium oxide, indium tin oxide containing titanium oxide, indium tin oxide, indium zinc oxide, indium tin oxide to which silicon oxide is added, or the like can be used.

The light-emitting element 7002 corresponds to a region where the EL layer 7004 including the light-emitting layer is sandwiched between the first electrode 7003 and the second electrode 7005. In the case of the pixel illustrated in FIG. 9C, light is emitted from the light-emitting element 7002 to the second electrode 7005 side as indicated by arrows.

In FIG. 9C, the drain electrode layer of the driving TFT 7001 is electrically connected to the first electrode 7003 through a contact hole formed in a silicon oxide layer 7051, a protective insulating layer 7052, a planarization insulating layer 7056, a planarization insulating layer 7053, and an insulating layer 7055. The planarization insulating layers 7053 and 7056 are formed using a resin material such as polyimide, acrylic, benzocyclobutene, polyamide, or epoxy. In addition to such resin materials, it is also possible to use a low-dielectric constant material (low-k material), a siloxane-based resin, phosphosilicate glass (PSG), borophosphosilicate glass (BPSG), or the like. Note that the planarization insulating layers 7053 and 7056 may be formed by stacking a plurality of insulating films formed of these materials. The planarization insulating layers 7053 and 7056 can be formed, depending on the material, with a method such as a sputtering method, an SOG method, a spin coating method, a dipping method, a spray coating method, or a droplet discharge method (e.g., an ink-jet method, screen printing, or offset printing), or with a means such as a doctor knife, a roll coater, a curtain coater, or a knife coater.

The partition 7009 is provided in order to insulate the first electrode 7003 from a first electrode of an adjacent pixel. The partition 7009 is formed using an organic resin film of polyimide, acrylic, polyamide, epoxy, or the like, an inorganic insulating film, or organic polysiloxane. It is particularly preferable that the partition 7009 be formed using a photosensitive resin material to have an opening portion over the first electrode 7003 so that a sidewall of the opening portion is formed as a tilted surface with continuous curvature. In the case where a photosensitive resin material is used for the partition 7009, a step of forming a resist mask can be omitted.

In the structure illustrated in FIG. 9C, for performing full-color display, the light-emitting element 7002, one of adjacent light-emitting elements, and the other of the adjacent light-emitting elements are, for example, a green emissive light-emitting element, a red emissive light-emitting element, and a blue emissive light-emitting element, respectively. Alternatively, a light-emitting display device capable of full color display may be manufactured using four kinds of light-emitting elements which include a white light-emitting element in addition to three kinds of light-emitting elements.

Further alternatively, in the structure of FIG. 9C, all of a plurality of light-emitting elements which are arranged may be white light-emitting elements and a sealing substrate having a color filter or the like may be arranged on the light-emitting element 7002, so that a light-emitting display device capable of full color display may be manufactured. A material which exhibits a single color such as white is formed and combined with a color filter or a color conversion layer, whereby full color display can be performed.

Needless to say, display of monochromatic light can also be performed. For example, a lighting system may be formed with the use of white light emission, or an area-color light-emitting device may be formed with the use of a single color light emission.

If necessary, an optical film such as a polarizing film including a circularly polarizing plate may be provided.

Note that, although the organic EL elements are described here as the light-emitting elements, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

This embodiment can be implemented combining with another embodiment as appropriate.

Embodiment 7

Figures 10A, 10B:
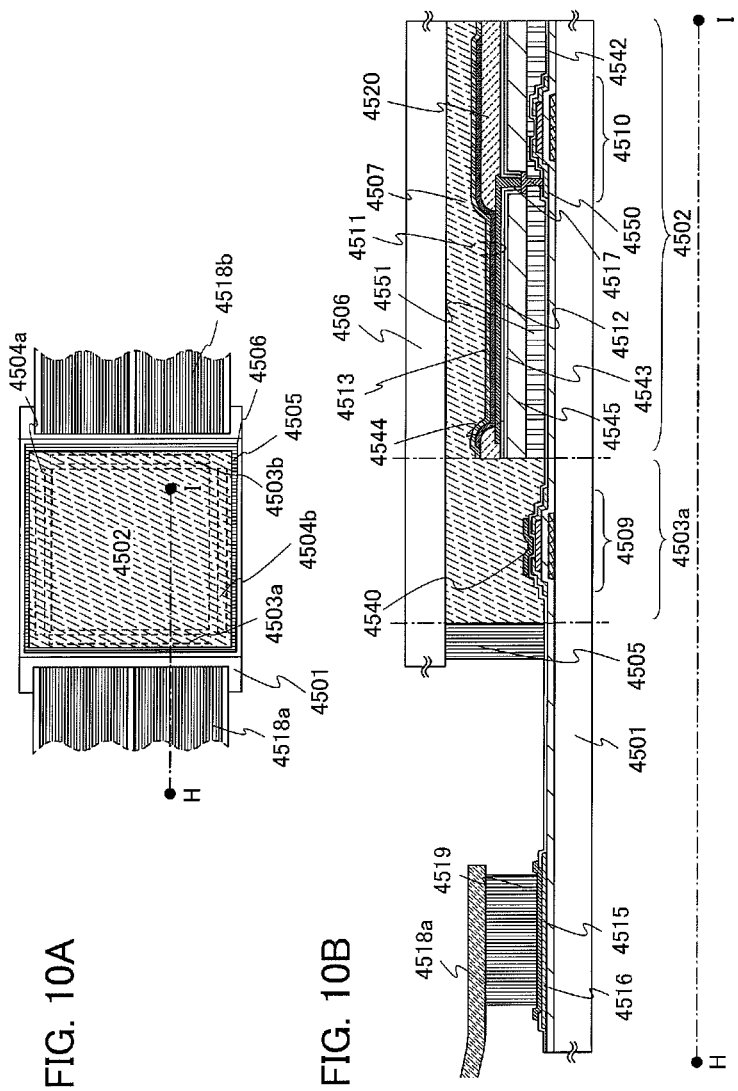
FIGS. 10A and 10B illustrate a semiconductor device.

In this embodiment, the appearance and a cross section of a light-emitting display panel (also referred to as a light-emitting panel) will be described with reference to FIGS. 10A and 10B. FIG. 10A is a plan view of a panel in which a thin film transistor and a light-emitting element are sealed between a first substrate and a second substrate with a sealant. FIG. 10B is a cross-sectional view taken along line H-I in FIG. 10A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 10B.

The thin film transistor described in any of Embodiments 1 to 5 can be applied to the thin film transistors 4509 and 4510. The similar step and material can be used for the thin film transistors 4509 and 4510. Each of the thin film transistors 4509 and 4510 includes a mixed region between an oxide semiconductor layer and a silicon oxide layer. The silicon oxide ($SiO_x$ where x is preferably equal to or larger than 2) layer including many defects (a large amount of oxygen dangling bonds is preferable) is stacked and heat treatment is performed, whereby hydrogen or water included in the oxide semiconductor layer is diffused to the silicon oxide layer; accordingly, hydrogen or water in the oxide semiconductor layer is reduced. When the thickness of the gate insulating layer is controlled to be equal to or larger than 100 nm and equal to or smaller than 350 nm, the thin film transistors 4509 and 4510 can have such stable electric characteristics that the difference of the threshold voltage value is 1V (±1V) or less, between before and after performance of a measurement in which a voltage of 30 V or −30 V is applied to the gate electrode (i.e., the gate voltage Vg is 30 V or −30 V) at a temperature of 85° C. for 12 hours. Therefore, the thin film transistors 4509 and 4510 have high reliability.

The thin film transistor 4509 in the driver circuit has the structure in which a conductive layer is provided so as to overlap a channel formation region of an oxide semiconductor layer of the thin film transistor. In this embodiment, the thin film transistors 4509 and 4510 are n-channel thin film transistors.

A conductive layer 4540 is provided over a silicon oxide layer 4542, so as to overlap a channel formation region of an oxide semiconductor layer in the thin film transistor 4509 in the driver circuit. The conductive layer 4540 is provided so as to overlap with the channel formation region of the oxide semiconductor layer, whereby the amount of shift in the threshold voltage of the thin film transistor 4509 before and after BT test can be reduced. Further, a potential of the conductive layer 4540 may be the same as or different from that of a gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

In addition, the conductive layer 4540 functions to block external electric field (particularly, block static electricity), that is, to prevent external electric field from acting the inside (a circuit portion including the thin film transistor). A blocking function of the conductive layer 4540 can prevent variation in electric characteristics of the thin film transistor due to the effect of external electric field such as static electricity.

Further, the silicon oxide layer 4542 covering the oxide semiconductor layer of the thin film transistor 4510 is formed. A source electrode layer or a drain electrode layer of the thin film transistor 4510 is electrically connected to a wiring layer 4550 in an opening formed in the silicon oxide layer 4542 and an insulating layer 4551 which are provided over the thin film transistor. The wiring layer 4550 is formed in contact with a first electrode 4517, and the thin film transistor 4510 is electrically connected to the first electrode 4517 via the wiring layer 4550.

The silicon oxide layer 4542 can be formed using a material and a method which are similar to those of the silicon oxide layer 116 described in Embodiment 1.

A color filter layer 4545 is formed over the insulating layer 4551 so as to overlap a light-emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4544 is formed over the overcoat layer 4543. The insulating layer 4544 can be formed in a manner similar to the protective insulating layer 103 described in Embodiment 1. For example, a silicon nitride film may be formed by a sputtering method.

The first electrode 4517 which is a pixel electrode included in the light-emitting element 4511 is electrically connected to the source electrode layer or the drain electrode layer of the thin film transistor 4510 via the wiring layer 4550. Note that the light-emitting element 4511 here has a stacked-layer structure of the first electrode 4517, an electroluminescent layer 4512, and the second electrode 4513, but there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material to have an opening portion over the first electrode 4517 so that a sidewall of the opening portion is formed as a tilted surface with continuous curvature.

The electroluminescent layer 4512 may be formed with a single layer or a plurality of layers stacked.

In order to prevent entry of oxygen, hydrogen, moisture, carbon dioxide, or the like into the light-emitting element 4511, a protective film may be formed over the second electrode 4513 and the partition 4520. As the protective film, a silicon nitride film, a silicon nitride oxide film, a DLC film, or the like can be formed.

In addition, a variety of signals and potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed using the same conductive film as the first electrode 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518*a* via an anisotropic conductive film 4519.

As the substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

As needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The sealant can be deposited using a screen printing method, an ink-jet apparatus, or a dispensing apparatus. As the sealant, typically, a material containing a visible light curable resin, an ultraviolet curable resin, or a thermosetting resin can be used. Further, a filler may be contained.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 10A and 10B.

Through the above process, a highly reliable light-emitting display device (display panel) as a semiconductor device can be manufactured.

This embodiment can be implemented combining with another embodiment as appropriate.

Embodiment 8

The appearance and a cross section of a liquid crystal display panel, which is an embodiment of a semiconductor device, will be described with reference to FIGS. 16A to 16C. FIGS. 16A and 16C are plan views of panels in each of which thin film transistors 4010 and 4011 and a liquid crystal element 4013 are sealed between a first substrate 4001 and a second substrate 4006 with a sealant 4005. FIG. 16B is a cross-sectional view taken along line M-N in FIGS. 16A and 16C.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 16A illustrates an example of mounting the signal line driver circuit 4003 by a COG method, and FIG. 16C illustrates an example of mounting the signal line driver circuit 4003 by a TAB method.

The pixel portion 4002 and the scan line driver circuit 4004 provided over the first substrate 4001 include a plurality of thin film transistors. FIG. 16B illustrates the thin film transistor 4010 included in the pixel portion 4002 and the thin film transistor 4011 included in the scan line driver circuit 4004. Insulating layers 4041 and 4021 and a protective insulating layer 4042 are provided over the thin film transistors 4010 and 4011.

The thin film transistor described in any of Embodiments 1 to 5 can be applied to the thin film transistors 4010 and 4011. The similar step and material can be used for the thin film transistors 4010 and 4011. Each of the thin film transistors 4010 and 4011 includes a mixed region between an oxide semiconductor layer and a silicon oxide layer. The silicon oxide ($SiO_x$ where x is preferably equal to or larger than 2) layer including many defects (a large amount of oxygen dangling bonds is preferable) is stacked and heat treatment is performed, whereby hydrogen or water included in the oxide semiconductor layer is diffused to the silicon oxide layer; accordingly, hydrogen or water in the oxide semiconductor layer is reduced. When the thickness of the gate insulating layer is controlled to be equal to or larger than 100 nm and equal to or smaller than 350 nm, the thin film transistors 4010 and 4011 can have such stable electric characteristics that the difference of the threshold voltage value is 1V (±1V) or less, between before and after performance of a measurement in which a voltage of 30 V or −30 V is applied to the gate electrode (i.e., the gate voltage Vg is 30 V or −30 V) at a temperature of 85° C. for 12 hours. Therefore, the thin film transistors 4010 and 4011 have high reliability.

A conductive layer 4040 is provided over an insulating layer 4021 so as to cover the thin film transistor 4011 for the driver circuit in the scan line driver circuit 4004. The conductive layer 4040 is formed together with a pixel electrode layer 4030 by processing the same conductive film. The pixel electrode layer 4030 is provided per pixel in the pixel portion 4002 and electrically connected to the driver thin film transistor in the pixel. On the other hand, the conductive layer 4040 is provided to cover the scan line driver circuit 4004 and electrically connected to a common wiring layer 4045. The common wiring layer 4045 is formed together with the source and drain electrode layers of the thin film transistor 4011 by processing the same conductive film. The conductive layer 4040 has a fixed potential, and the potential can be controlled by connecting the conductive layer 4040 to a GND line (ground line), for example.

The conductive layer 4040 provided over the scan line driver circuit 4004 can block the external electric field, that is, prevent the external electric field from affecting operation of the thin film transistor 4011 in the scan line driver circuit 4004. Thus, shift of the threshold voltage value of the thin film transistor 4011 in the scan line driver circuit 4004 can be prevented.

In addition, a pixel electrode layer 4030 of a liquid crystal element 4013 is electrically connected to a source electrode layer or a drain electrode layer of the thin film transistor 4010. A counter electrode layer 4031 of the liquid crystal element 4013 is provided for the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. As plastics, a fiberglass-reinforced plastics (FRP) plate, a polyvinyl fluoride (PVF) film, a polyester film, or an acrylic resin film can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may also be used. In addition, the counter electrode layer 4031 is electrically connected to a common potential line formed over the same substrate as the thin film transistor 4010. With use of the common connection portion, the counter electrode layer 4031 and the common potential line can be electrically connected to each other by conductive particles arranged between a pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence. In addition, rubbing treatment is unnecessary because an alignment film in not necessarily provided; accordingly, electrostatic discharge damage caused by the rubbing treatment can be prevented and defects and damage of the liquid crystal display device in the manufacturing process can be reduced. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor that uses an oxide semiconductor layer.

Note that this embodiment can also be applied to a transflective liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film serving as a black matrix may be provided in a portion other than the display portion.

Over the thin film transistors 4011 and 4010, the insulating layer 4041 is formed in contact with the oxide semiconductor layers. The material and the method for forming the silicon oxide layer 116 described in Embodiment 1 can be applied to the insulating layer 4041. In this embodiment, a silicon oxide layer including defects is formed as the insulating layer 4041 by a sputtering method with the use of Embodiment 1. Further, the protective insulating layer 4042 is formed on and in contact with the insulating layer 4041. The protective insulating layer 4042 can be formed in a similar manner to that of the protective insulating layer 103 described in Embodiment 1; for example, a silicon nitride film can be used. In addition, in order to reduce the surface roughness of the thin film transistors, the protective insulating layer 4042 is covered with the insulating layer 4021 functioning as a planarization insulating film.

The insulating layer 4021 is formed as the planarization insulating film. As the insulating layer 4021, an organic material having heat resistance such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed of these materials.

There is no particular limitation on the method of forming the insulating layer 4021, and any of the following methods or tools can be used depending on a material thereof: a method such as a sputtering method, an SOG method, a spin coating method, a dipping method, a spray coating method, or a droplet discharge method (e.g., an ink-jet method, screen printing, or offset printing), or a tool such as a doctor knife, a roll coater, a curtain coater, a knife coater, or the like. The baking step of the insulating layer 4021 also serves as annealing of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Conductive compositions including a conductive high molecule (also referred to as a conductive polymer) can be used for the pixel electrode layer 4030 and the counter electrode layer 4031. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive high molecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit 4003 which is formed separately, the scan line driver circuit 4004, or the pixel portion 4002 from an FPC 4018.

In this embodiment, a connection terminal electrode 4015 is formed using the same conductive film as the pixel electrode layer 4030 included in the liquid crystal element 4013. A terminal electrode 4016 is formed using the same conductive film as the source and drain electrode layers included in the thin film transistors 4010 and 4011.

The connection terminal electrode 4015 is electrically connected to a terminal included in the FPC 4018 via an anisotropic conductive film 4019.

Note that FIGS. 16A to 16C illustrate an example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Although not illustrated in this embodiment, a black matrix (a light-shielding layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In displaying moving images, a liquid crystal display device has a problem that a long response time of liquid crystal molecules themselves causes afterimages or blurring of moving images. In order to improve the moving-image characteristics of a liquid crystal display device, a driving method called black insertion is employed in which black is displayed on the whole screen every other frame period.

Moreover, a driving method called double-frame rate driving may be employed in which the vertical synchronizing frequency is 1.5 times or more, preferably twice or more as high as a conventional vertical synchronizing frequency, whereby the moving-image characteristics are improved.

Further alternatively, in order to improve the moving-image characteristics of a liquid crystal display device, a driving method may be employed, in which a plurality of LEDs (light-emitting diodes) or a plurality of EL light sources are used to form a surface light source as a backlight, and each light source of the surface light source is independently driven in a pulsed manner in one frame period. As the surface light source, three or more kinds of LEDs may be used and an LED emitting white light may be used. Since a plurality of LEDs can be controlled independently, the light emission timing of LEDs can be synchronized with the timing at which a liquid crystal layer is optically modulated. According to this driving method, LEDs can be partly turned off; therefore, an effect of reducing power consumption can be obtained particularly in the case of displaying an image having a large part on which black is displayed.

By combining these driving methods, the display characteristics of a liquid crystal display device, such as moving-image characteristics, can be improved as compared to those of conventional liquid crystal display devices.

Since a thin film transistor is easily broken due to static electricity or the like, a protective circuit is preferably provided over the same substrate as the pixel portion or the drive circuit. The protective circuit is preferably formed with a non-linear element including an oxide semiconductor layer. For example, a protective circuit is provided between the pixel portion, and a scan line input terminal and a signal line input terminal. In this embodiment, a plurality of protective circuits are provided so as to prevent breakage of the a pixel transistor and the like which can be caused when a surge voltage due to static electricity or the like is applied to a scan line, a signal line, and a capacitor bus line. Therefore, the protective circuit is formed so as to release charge to a common wiring when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can also be formed through the same step as the thin film transistor in the pixel portion, and can be made to have the same properties as a diode by connecting a gate terminal to a drain terminal of the non-linear element.

For the liquid crystal display module, a twisted nematic (TN) mode, an In-Plane-Switching (IPS) mode, a patterned vertical alignment (PVA) mode, an Axially Symmetric aligned Micro-cell (ASM) mode, an optically compensated birefringence (OCB) mode, a ferroelectric liquid crystal (FLC) mode, an antiferroelectric liquid crystal (AFLC) mode, or the like can be used.

There is no particular limitation to the liquid crystal display device disclosed in this specification, and a liquid crystal display device including a TN liquid crystal, an OCB liquid crystal, an STN liquid crystal, a VA liquid crystal, an ECB liquid crystal, a GH liquid crystal, a polymer dispersed liquid crystal, a discotic liquid crystal, or the like can be used. In particular, a normally black liquid crystal panel such as a transmissive liquid crystal display device utilizing a vertical alignment (VA) mode is preferable. Some examples are given as the vertical alignment mode. For example, an MVA (multi-domain vertical alignment) mode, a PVA (patterned vertical alignment) mode, and an ASV mode can be used.

An example of a VA liquid crystal display device is described below.

The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 12:
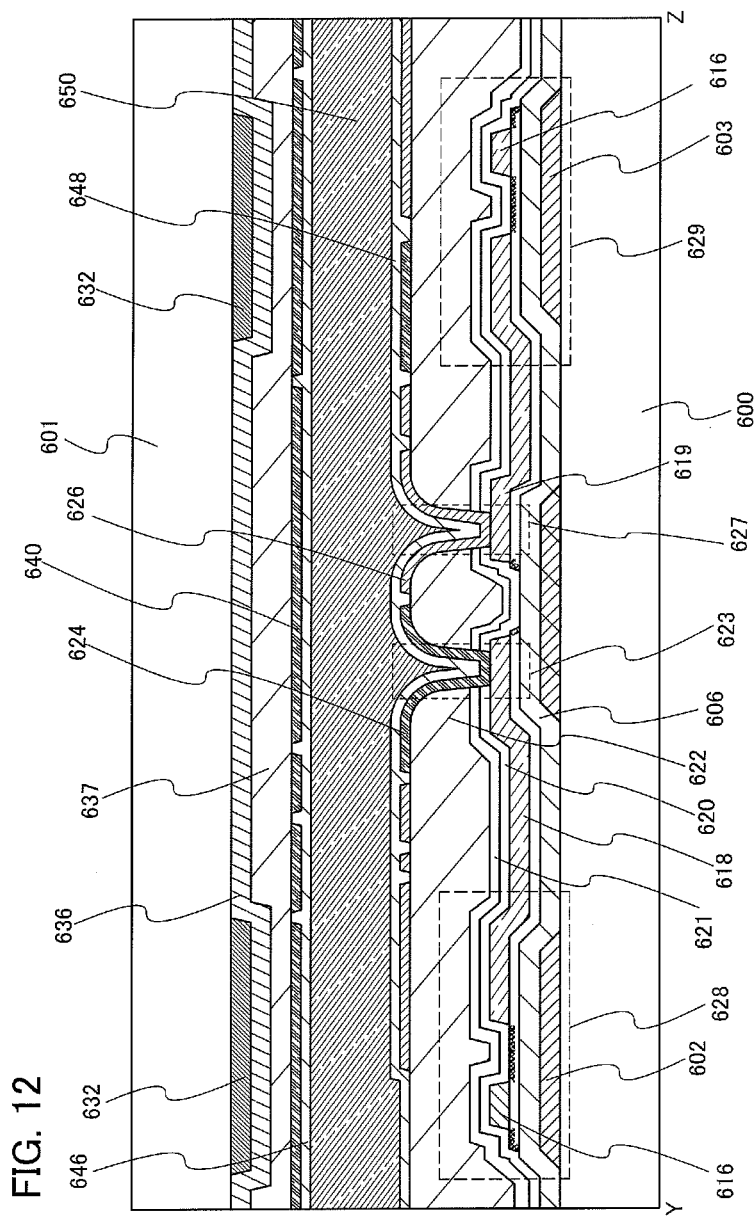
FIG. 12 illustrates a semiconductor device.
Figure 13:
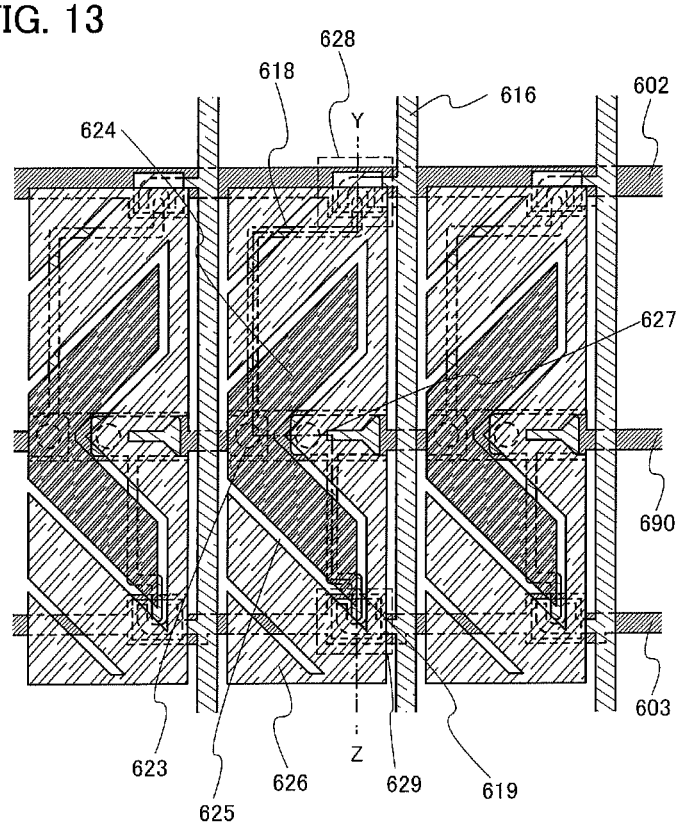
FIG. 13 illustrates a semiconductor device.

FIGS. 12 and 13 each illustrate a pixel structure of the VA liquid crystal display device. FIG. 13 is a plan view over a substrate 600. FIG. 12 illustrates a cross-sectional structure taken along line Y-Z in FIG. 13. Description below will be given with reference to both the drawings.

In this pixel structure, a plurality of pixel electrode layers are provided in one pixel, and a TFT is connected to each pixel electrode layer. The plurality of TFTs are constructed so as to be driven by different gate signals. In other words, signals applied to individual pixel electrode layers in a multi-domain pixel are controlled independently of each other.

A pixel electrode layer 624 is connected to a TFT 628 through a wiring 618 in a contact hole 623 penetrating an insulating film 620, an insulating film 621, and an insulating film 622. A pixel electrode layer 626 is connected to a TFT 629 through a wiring 619 in a contact hole 627 penetrating the insulating film 620, the insulating film 621, and the insulating film 622. A gate wiring 602 of the TFT 628 is separated from a gate wiring 603 of the TFT 629 so that different gate signals can be supplied. On the other hand, a wiring 616 serving as a data line is shared by the TFTs 628 and 629. As each of the TFTs 628 and 629, any of the thin film transistors described in Embodiments 1 to 5 can be used as appropriate. Note that the gate insulating layer 606 is formed over the gate wiring 602 and the gate wiring 603. The TFTs 628 and 629 are each such a transistor that in order to suppress variation in electric characteristics, the thickness of a gate insulating layer is controlled to be larger than or equal to 100 nm and smaller than or equal to 350 nm, so that an impurity serving as a variation factor, such as hydrogen or moisture is prevented from being included in an oxide semiconductor layer and an interface between the oxide semiconductor layer and an oxide insulating layer (a silicon oxide layer) in contact with the oxide semiconductor layer, and the hydrogen concentration is $5\times10^{19}/cm^3$ or lower, preferably, $1\times10^{19}/cm^3$ or lower.

Further, a storage capacitor is formed using a capacitor wiring 690, the gate insulating layer 606 as a dielectric, and the pixel electrode or a capacitor electrode electrically connected to the pixel electrode.

Figure 15:
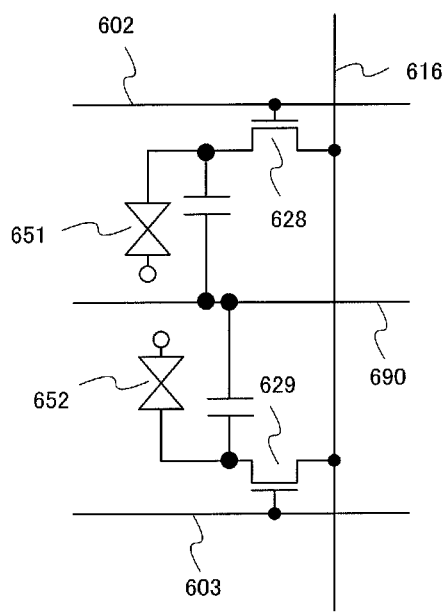
FIG. 15 illustrates an equivalent circuit of a pixel in a semiconductor device.

The shape of the pixel electrode layer 624 is different from that of the pixel electrode layer 626, and the pixel electrode layers are separated by slits 625. The pixel electrode layer 626 is formed so as to surround the external side of the pixel electrode layer 624 which spreads into a V shape. The timings at which voltages are applied to the pixel electrode layers 624 and 626 are made to be different in TFTs 628 and 629, whereby alignment of liquid crystals is controlled. FIG. 15 shows an equivalent circuit of this pixel structure. Both the TFTs 628 and 629 are connected to the wiring 616. When different gate signals are supplied to the gate wirings 602 and 603, operation of the TFTs 628 and 629 is individually controlled, so that alignment of liquid crystals can be precisely controlled; accordingly, viewing angle can be increased.

Figure 14:
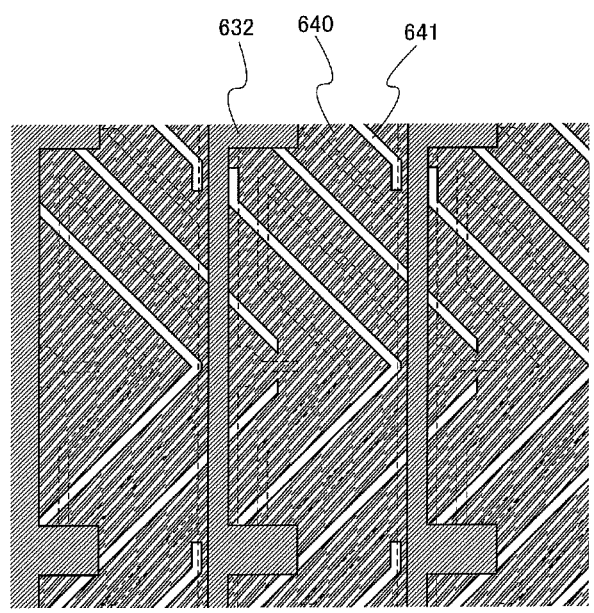
FIG. 14 illustrates a semiconductor device.

The counter substrate 601 is provided with a light-blocking film 632, a coloring film 636, and a counter electrode layer 640. A planarization film 637 which is also called an overcoat film is formed between the coloring film 636 and the counter electrode layer 640 to prevent alignment disorder of liquid crystals. FIG. 14 illustrates the structure of the counter substrate side. The counter electrode layer 640 is an electrode shared by different pixels and slits 641 are formed. The slit 641 and the slit on the side of the pixel electrode layers 624 and 626 are alternately arranged in an engaging manner; thus, an oblique electric field is effectively generated, and the alignment of liquid crystals can be controlled. Accordingly, the orientation of the liquid crystals can be varied in different places, so that the viewing angle is widened.

The counter electrode layer 640 is a first counter electrode layer provided in a pixel portion and has the same potential as the second counter electrode layer which has an opening pattern and is provided in a driver circuit portion. When the second counter electrode layer having an opening pattern is provided in the driver circuit portion, a highly reliable semiconductor device with low power consumption can be manufactured.

Further, the pixel electrode layer 624, the liquid crystal layer 650, and the counter electrode layer 640 overlap with each other, so that a first liquid crystal element is formed. The pixel electrode layer 626, the liquid crystal layer 650, and the counter electrode layer 640 overlap with each other to form a second liquid crystal element. Furthermore, the multi-domain structure is employed in which the first liquid crystal element and the second liquid crystal element are provided for one pixel.

This embodiment can be implemented combining with another embodiment as appropriate.

Embodiment 9

In this embodiment, an example of an electronic paper will be described as a semiconductor device of one embodiment of the present invention.

Figure 11:
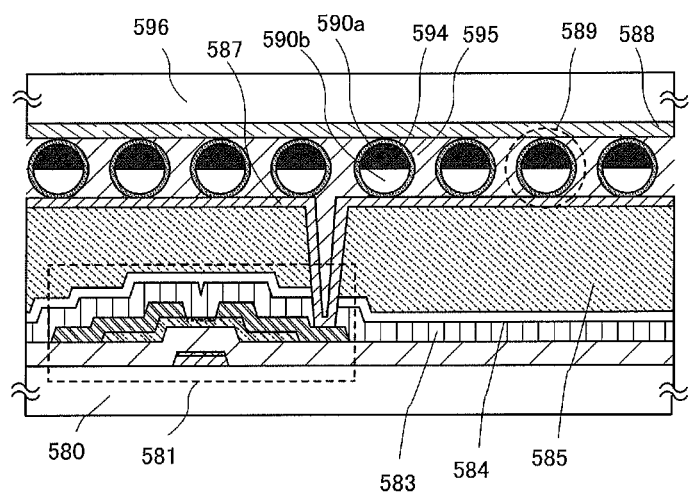
FIG. 11 illustrates a semiconductor device.

FIG. 11 illustrates an active matrix electronic paper as an example of a semiconductor device to which an embodiment of the present invention is applied. As a thin film transistor 581 used in the semiconductor device, the thin film transistor which is described in any one of Embodiments 1 to 5 can be used as appropriate, and the thin film transistor 581 can formed using the same material through the same steps. The thin film transistor 581 includes a mixed region between an oxide semiconductor layer and a silicon oxide layer. The silicon oxide ($SiO_x$ where x is preferably equal to or larger than 2) layer including defects (a large amount of oxygen dangling bonds is preferable) is stacked and heat treatment is performed, whereby hydrogen or water contained in the oxide semiconductor layer is diffused to the silicon oxide layer, so that hydrogen or water in the oxide semiconductor layer is reduced. Therefore, the thin film transistor 581 has high reliability.

The electronic paper in FIG. 11 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 formed over a substrate 580 has a bottom-gate structure in which source and drain electrode layers are electrically connected to a first electrode layer 587 via an opening formed in a silicon oxide layer 583, a protective insulating layer 584 and an insulating layer 585.

Thus, in the case where a measurement is performed on the thin film transistor 581 included in a semiconductor device of this embodiment, in which a voltage of 30 V or −30 V is applied to a gate electrode (i.e., the gate voltage Vg is set to 30 V or −30 V) at a temperature of 85° C. for 12 hours, the difference of the threshold voltage of the thin film transistor 110 is 1 V (±1 V) or less, between before and after performance of the measurement. In the thin film transistor 581, the thickness of the gate insulating layer is controlled to be equal to or larger than 100 nm and equal to or smaller than 350 nm, and the hydrogen concentrations in the oxide semiconductor layer and the interface between the oxide semiconductor layer and the oxide insulating layer (the silicon oxide layer) formed in contact therewith are controlled to be $5\times10^{19}/cm^3$ or lower, preferably, $1\times10^{19}/cm^3$ or lower.

Between the first electrode layer 587 and a second electrode layer 588, spherical particles 589 each having a black region 590a, a white region 590b, and a cavity 594 which is filled with liquid around the black region 590a and the white region 590b are provided. A space around the spherical particles 589 is filled with a filler 595 such as a resin (see FIG. 11). In this embodiment, the first electrode layer 587 corresponds to a pixel electrode and the second electrode layer 588 provided on a counter substrate 596 corresponds to a common electrode.

Further, instead of the twisting ball, an electrophoretic element can also be used. A microcapsule having a diameter of about 10 μm to 200 μm in which transparent liquid, positively-charged white microparticles, and negatively-charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be implemented combining with another embodiment as appropriate.

Embodiment 10

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 17A:
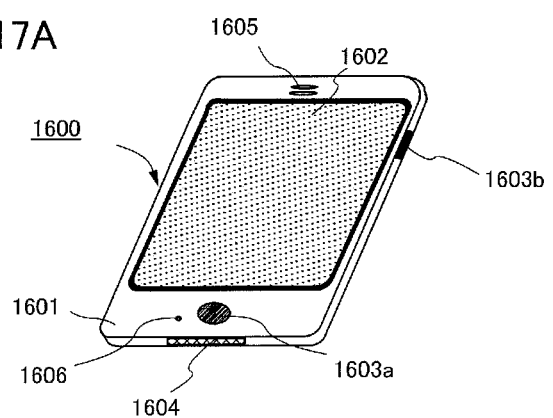
FIGS. 17A and 17B each illustrate an electronic device.

FIG. 17A illustrates an example of a mobile phone. A mobile phone 1600 is provided with a display portion 1602 incorporated in a housing 1601, operation buttons 1603a and 1603b, an external connection port 1604, a speaker 1605, a microphone 1606, and the like.

Information can be input to the mobile phone 1600 illustrated in FIG. 17A by touching the display portion 1602 with a finger or the like. In addition, operations such as making calls, composing mails, and the like can be conducted when a person touches the display portion 1602 with his/her finger or the like.

There are mainly three screen modes of the display portion 1602. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1602 so that text displayed on a screen can be input. In that case, it is preferable to display a keyboard or number buttons on almost all area of the screen of the display portion 1602.

When a detection device including a sensor for detecting inclination, such as a gyroscope or an acceleration sensor, is provided inside the mobile phone 1600, display of the screen on the display portion 1602 can be automatically switched by determining the direction of the mobile phone 1600 (whether the mobile phone 1600 is placed horizontally or vertically for a landscape mode or a portrait mode).

The screen modes are changed by touching the display portion 1602 or using the operation buttons 1603a and 1603b of the housing 1601. Alternatively, the screen mode may be switched depending on the kind of images displayed on the display portion 1602. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1602 is not performed for a certain period while a signal detected by the optical sensor in the display portion 1602 is detected, the screen mode may be controlled so as to be switched from the input mode to the display mode.

The display portion 1602 may function as an image sensor. For example, an image of a palm print, a fingerprint, or the like is taken by touching the display portion 1602 with the palm or the finger, whereby personal authentication can be performed. Further, by providing a backlight or a sensing light source which emits a near-infrared light in the display portion, an image of a finger vein, a palm vein, or the like can be taken.

Any of the semiconductor devices described in the above embodiments can be applied to the display portion 1602. For example, a plurality of thin film transistors described in the above embodiments can be disposed as switching elements in pixels.

Figure 17B:
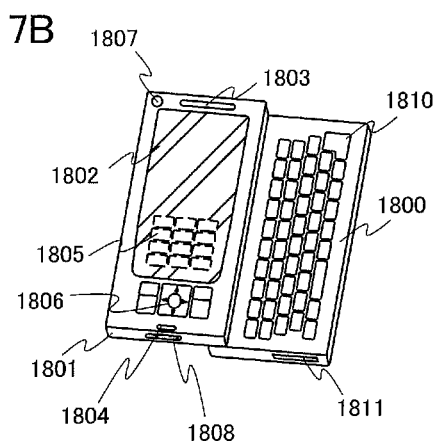

FIG. 17B also illustrates an example of a mobile phone. A portable information terminal such as the one illustrated in FIG. 17B can have a plurality of functions. For example, in addition to a telephone function, such a portable information terminal can have a function of processing a variety of pieces of data by incorporating a computer.

The portable information terminal illustrated in FIG. 17B has a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1800.

The display panel 1802 is provided with a touch panel. A plurality of operation keys 1805 which is displayed as images is illustrated by dashed lines in FIG. 17B.

Further, in addition to the above structure, a contactless IC chip, a small memory device, or the like may be incorporated.

Any of the semiconductor devices described in the above embodiments can be used for the display panel 1802 and the direction of display is changed appropriately depending on an application mode. Further, the camera lens 1807 is provided on the same surface as the display panel 1802, and thus a videophone is realized. The speaker 1803 and the microphone 1804 can be used for videophone calls, recording, and playing sound, etc. as well as voice calls. Moreover, the housings 1800 and 1801 in a state where they are developed as illustrated in FIG. 17B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 18A:
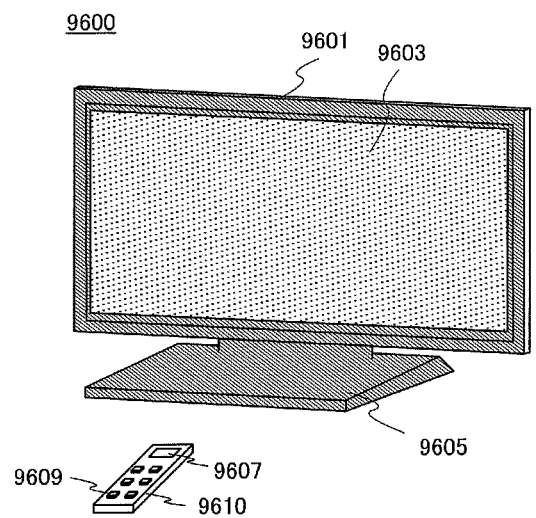
FIGS. 18A and 18B each illustrate an electronic device.

FIG. 18A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the use of the receiver, general television broadcasting can be received. With the use of the receiver, general television broadcasting can be received. Moreover, when the television set 9600 is connected to a communication network with or without wires via the modem, one-way (from a sender to a receiver) or two-way (between a sender and a receiver or between receivers) data communication can be performed.

Any of the semiconductor devices described in the above embodiments can be applied to the display portion 9603. For example, a plurality of thin film transistors described in the above embodiments can be disposed as switching elements in pixels.

Figure 18B:
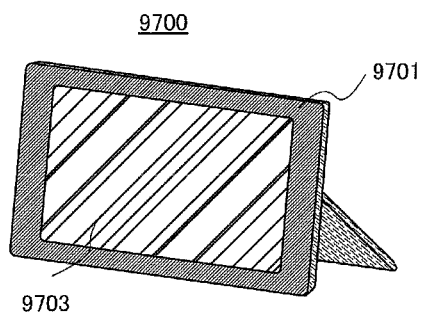

FIG. 18B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame Any of the semiconductor devices described in the above embodiments can be applied to the display portion 9703. For example, a plurality of thin film transistors described in the above embodiments can be disposed as switching elements in pixels.

Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 19:
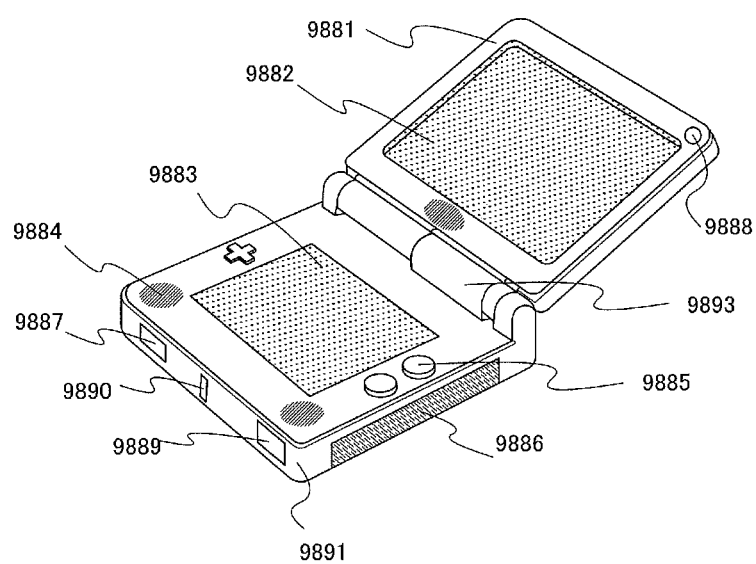
FIG. 19 illustrates an electronic device.

FIG. 19 illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively.

Any of the semiconductor devices described in the above embodiments can be applied to the display portion 9883. For example, a plurality of thin film transistors described in the above embodiments can be disposed as switching elements in pixels.

In addition, the portable amusement machine illustrated in FIG. 19 includes a speaker portion 9884, a recording medium insertion portion 9886, an LED lamp 9890, an input unit (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a thin film transistor disclosed in this specification can be employed. The portable amusement machine may include other accessory equipment as appropriate. The portable amusement machine illustrated in FIG. 19 has a function of reading a program or data stored in a recording medium to display it on the display portion, and a function of sharing information with another portable amusement machine by wireless communication. The portable amusement machine illustrated in FIG. 19 can have various functions without limitation to the above.

Figure 21:
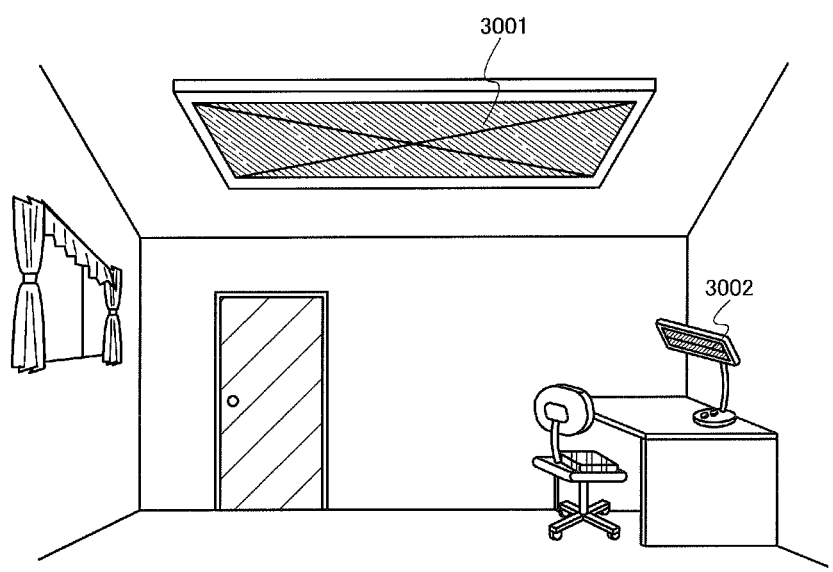
FIG. 21 illustrates an electronic device.

FIG. 21 illustrates an example in which the light-emitting device which is an example of the semiconductor device formed using any of the above embodiments is used as an indoor lighting device 3001. Since the light-emitting device described in this specification can be increased in area, the light-emitting device can be used as a lighting device having a large area. In addition, any of the light-emitting devices described in the above embodiments can be also used as a desk lamp 3002. Note that lighting equipment includes, in its category, a wall light, a lighting device in a car, a guide light and the like, as well as a ceiling light and a desk lamp.

In the above-described manner, the semiconductor device described in any of Embodiments 1 to 9 can be applied to a display panel of a variety of electronic devices such as the ones described above, whereby highly reliable electronic devices can be provided.

Embodiment 11

A semiconductor device disclosed in this specification can be applied to an electronic paper. An electronic paper can be used for electronic devices of a variety of fields as long as they can display data. For example, an electronic paper can be applied to an e-book reader (electronic book), a poster, an advertisement in a vehicle such as a train, or displays of various cards such as a credit card. An example of the electronic device is illustrated in FIG. 20.

Figure 20:
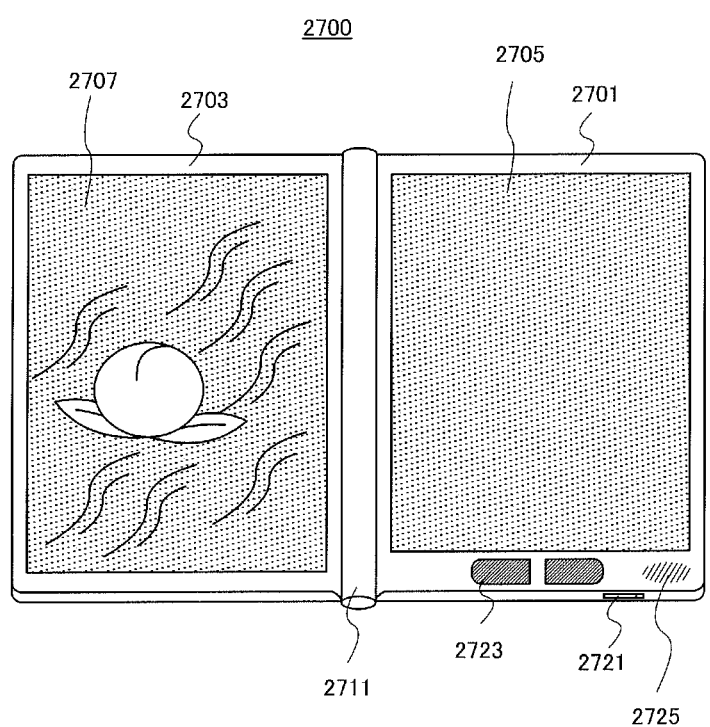
FIG. 20 illustrates an electronic device.

FIG. 20 illustrates an example of an electronic book reader. For example, an electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, text can be displayed on a display portion on the right side (the display portion 2705 in FIG. 20) and images can be displayed on a display portion on the left side (the display portion 2707 in FIG. 20).

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to an AC adapter or various cables such as a USB cable, or the like), a recording medium insertion portion, or the like may be provided on the back surface or the side surface of the housing. Moreover, the electronic book reader 2700 may have a function of an electronic dictionary.

Further, the electronic book reader 2700 may send and receive information wirelessly. Through wireless communication, desired book data or the like can be purchased and downloaded from an electronic book server.

This embodiment can be implemented combining with another embodiment as appropriate.

This application is based on Japanese Patent Application serial no. 2009-235104 filed with Japan Patent Office on Oct. 9, 2009, the entire contents of which are hereby incorporated by reference.

EXPLANATION OF REFERENCE

100: substrate, 101: gate electrode layer, 102: gate insulating layer, 103: protective insulating layer, 110: thin film transistor, 112: oxide semiconductor layer, 115*a*: source electrode layer, 115*b*: drain electrode layer, 116: silicon oxide layer, 118*a*: oxide conductive layer, 118*b*: oxide conductive layer, 119: mixed region, 120: oxide semiconductor film, 121: oxide semiconductor layer, 130: thin film transistor, 140: substrate, 141: oxide semiconductor layer, 142: gate insulating layer, 150: substrate, 151: gate electrode layer, 152*a*: gate insulating layer, 152*b*: gate insulating layer, 153: protective insulating layer, 160: thin film transistor, 162: oxide semiconductor layer, 163: silicon oxide layer, 165*a*: source electrode layer, 165*b*: drain electrode layer, 166: silicon oxide layer, 171: oxide semiconductor layer, 173: silicon oxide layer, 179: mixed region, 181: gate electrode layer, 183: protective insulating layer, 190: thin film transistor, 192: oxide semiconductor layer, 195*a*: source electrode layer, 195*b*: drain electrode layer, 196: silicon oxide layer, 199: mixed region, 580: substrate, 581: thin film transistor, 583: silicon oxide layer, 584: protective insulating layer, 585: insulating layer, 587: electrode layer, 588: electrode layer, 589: spherical particle, 594: cavity, 595: filler, 596: counter substrate, 600: substrate, 601: counter substrate, 602: gate wiring, 603: gate wiring: 606: gate insulating layer, 616: wiring: 618: wiring: 619: wiring: 620: insulating film, 621: insulating film, 622: insulating film, 623: contact hole, 624: pixel electrode layer, 625: slit, 626: pixel electrode layer, 627: contact hole, 628: TFT, 629: TFT, 632: light-blocking film, 636: coloring film, 637: planarization film, 640: counter electrode layer, 641: slit, 650: liquid crystal layer, 690: capacitor wiring, 1000: film formation apparatus, 1100: transfer chamber, 1101: transfer unit, 1110: loading chamber, 1111: cassette, 1120: unloading chamber, 1121: cassette, 1200: transfer chamber, 1201: transfer unit, 1205: evacuation unit, 1210: treatment chamber, 1211: substrate heating unit, 1215: evacuation unit, 1220: treatment chamber, 1225: evacuation unit, 1230: treatment chamber, 1235: evacuation unit, 1240: treatment chamber, 1245: evacuation unit, 1600: mobile phone, 1601: housing, 1602: display portion, 1603*a*: operation button, 1603*b*: operation button, 1604: external connection port, 1605: speaker, 1606: microphone, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 2700: electronic book reader, 2701: housing, 2703: housing, 2705: display portion, 2707: display portion, 2711: hinge, 2721: power switch, 2723: operation key, 2725: speaker, 3000: film formation apparatus, 3001: lighting device, 3002: desk lamp, 3100: transfer chamber, 3101: transfer unit, 3105: evacuation unit, 3110: loading chamber, 3111: cassette, 3115: evacuation unit, 3120: unloading chamber, 3121: cassette, 3125: evacuation unit, 3210: treatment chamber, 3211: substrate heating unit, 3215: evacuation unit, 3220: treatment chamber, 3225: evacuation unit, 3230: treatment chamber, 3235: evacuation unit, 3240: treatment chamber, 3241: substrate heating unit, 3245: evacuation unit, 3250: treatment chamber, 3251: cooling unit, 3255: evacuation unit, 4001: substrate, 4002: pixel portion, 4003: signal line driver circuit, 4004: scan line driver circuit, 4005: sealant, 4006: substrate, 4008: liquid crystal layer, 4010: thin film transistor, 4011: thin film transistor, 4013: liquid crystal element, 4015: connection terminal electrode, 4016: terminal electrode, 4018: FPC, 4019: anisotropic conductive film, 4021: insulating layer, 4030: pixel electrode layer, 4031: counter electrode layer, 4032: insulating layer, 4033: insulating layer, 4035: spacer, 4040: conductive layer, 4041: insulating layer, 4042: protective insulating layer, 4045: common wiring layer, 4501: first substrate, 4502: pixel portion, 4503*a*: signal line driver circuit, 4503*b*: signal line driver circuit, 4504*a*: scan line driver circuit, 4504*b*: scan line driver circuit, 4505: sealant, 4506: second substrate, 4507: filler, 4509: thin film transistor, 4510: thin film transistor, 4511: light-emitting element, 4512: electroluminescent layer, 4513: second electrode, 4515: connection terminal electrode, 4516: terminal electrode, 4517: first electrode, 4518*a*: FPC, 4518*b*: FPC, 4519: anisotropic conductive film, 4520: partition, 4540: conductive layer, 4542: silicon oxide layer, 4543: overcoat layer, 4544: insulating layer, 4545: color filter layer, 4550: wiring layer, 4551: insulating layer, 5001: dry pump, 5002: evacuation chamber, 5003: power supply, 5004: target, 5005: cathode, 5006: stage elevator, 5007: substrate stage, 5008: gate valve, 5009: cooling water, 5010: flow rate controller, 5011: gas tank, 590*a*: black region, 590*b*: white region, 6400: pixel, 6401: switching transistor, 6402: driving transistor, 6403: capacitor, 6404: light-emitting element, 6405: signal line, 6406: scan line, 6407: power supply line, 6408: common electrode, 7001: driving TFT, 7002: light-emitting element, 7003: first electrode, 7004: EL layer, 7005: second electrode, 7009: partition, 7011: driving TFT, 7012: light-emitting element, 7013: first electrode, 7014: EL layer, 7015: second electrode, 7016: light-blocking film, 7017: conductive film, 7019: partition, 7021: driving TFT, 7022: light-emitting element, 7023: first electrode, 7024: EL layer, 7025: second electrode, 7027: conductive film, 7029: partition, 7031: insulating layer, 7032: insulating layer, 7033: color filter layer, 7034: overcoat layer, 7035: protective insulating layer, 7036: planarization insulating layer, 7042: insulating layer, 7043: color filter layer, 7044: overcoat layer, 7045: protective insulating layer, 7046: planarization insulating layer, 7051: silicon oxide layer, 7052: protective insulating layer, 7053: planarization insulating layer, 7055: insulating layer, 7056: planarization insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: connection portion

The invention claimed is:

1. A semiconductor device comprising:
   a transistor, the transistor comprising:
   a gate electrode layer;
   a gate insulating layer with a thickness equal to or larger than 100 nm and equal to or smaller than 350 nm;
   an oxide semiconductor layer comprising indium, gallium, and zinc over the gate insulating layer;
   a source electrode layer and a drain electrode layer in contact with the oxide semiconductor layer;
   a silicon oxide layer over the source electrode layer and the drain electrode layer, the silicon oxide layer being in contact with the oxide semiconductor layer;
   a mixed region between the oxide semiconductor layer and the silicon oxide; and
   a protective insulating layer comprising nitrogen over and in contact with the silicon oxide layer,
   wherein the mixed region comprises oxygen, silicon, and at least one of indium, gallium, and zinc,
   wherein a thickness of the mixed region is from 1 nm to 10 nm, and
   wherein a difference of a threshold voltage value of the transistor is 1 V or less, between before and after performance of a measurement in which a voltage of 30 V or −30 V is applied to the gate electrode layer at a temperature of 85° C. for 12 hours.

2. The semiconductor device according to claim 1, wherein the source electrode layer comprises an element selected from Al, Cr, Cu, Ta, Ti, Mo, and W.

3. The semiconductor device according to claim 1, wherein a thickness of the mixed region is from 2 nm to 5 nm.

4. The semiconductor device according to claim 1, wherein the mixed region comprises a metal element M existing in a state any of M-OH, M-H, M-O—Si—H, and M-O—Si—OH.

5. A semiconductor device comprising:
   a transistor, the transistor comprising:
   a gate electrode layer;
   a gate insulating layer with a thickness equal to or larger than 100 nm and equal to or smaller than 350 nm;
   an oxide semiconductor layer comprising indium, gallium, and zinc over the gate insulating layer;
   a source electrode layer and a drain electrode layer in contact with the oxide semiconductor layer; and
   a silicon oxide layer over and in contact with the oxide semiconductor layer,
   wherein a mixed region is placed at an interface between the oxide semiconductor layer and the silicon oxide,
   wherein a hydrogen concentration in the interface is $5 \times 10^{19}/cm^3$ or lower,
   wherein the mixed region comprises oxygen, silicon, and at least one of indium, gallium, and zinc,
   wherein a thickness of the mixed region is from 1 nm to 10 nm, and
   wherein a difference of a threshold voltage value of the transistor is 1 V or less, between before and after performance of a measurement in which a voltage of 30 V or −30 V is applied to the gate electrode layer at a temperature of 85° C. for 12 hours.

6. The semiconductor device according to claim 5, wherein the source electrode layer comprises an element selected from Al, Cr, Cu, Ta, Ti, Mo, and W.

7. The semiconductor device according to claim 5, wherein a thickness of the mixed region is from 2 nm to 5 nm.

8. The semiconductor device according to claim 5, wherein the mixed region comprises a metal element M existing in a state any of M-OH, M-H, M-O—Si—H, and M-O—Si—OH.

* * * * *